United States Patent
Jang et al.

(10) Patent No.: US 11,271,521 B2
(45) Date of Patent: Mar. 8, 2022

(54) SOLAR CELL MODULE

(71) Applicant: LG ELECTRONICS INC., Seoul (KR)

(72) Inventors: Daehee Jang, Seoul (KR); Minpyo Kim, Seoul (KR); Bojoong Kim, Seoul (KR); Seeun Hong, Seoul (KR); Taeyoon Kim, Seoul (KR); Hwanyeon Kim, Seoul (KR); Jongkyoung Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 329 days.

(21) Appl. No.: 14/061,434

(22) Filed: Oct. 23, 2013

(65) Prior Publication Data

US 2014/0109952 A1 Apr. 24, 2014

(30) Foreign Application Priority Data

Oct. 23, 2012 (KR) .................. 10-2012-0117783
Feb. 28, 2013 (KR) .................. 10-2013-0022148

(51) Int. Cl.
*H02S 40/22* (2014.01)
*H01L 31/0236* (2006.01)
(Continued)

(52) U.S. Cl.
CPC ........ *H02S 40/22* (2014.12); *H01L 31/02366* (2013.01); *H01L 31/048* (2013.01);
(Continued)

(58) Field of Classification Search
CPC ..... G02B 1/10; H01L 31/048; H01L 31/0236; H01L 31/0543; H01L 31/068; H01L 31/02366; H01L 31/02363; H01L 31/022425; H01L 31/022458; H01L 31/0682; H01L 31/0684; H01L 21/0276; H01L 31/054; H01L 33/44;
(Continued)

(56) References Cited

U.S. PATENT DOCUMENTS 4,053,327 A * 10/1977 Meulenberg, Jr. ............ 136/256
4,190,321 A * 2/1980 Dorer et al. .................. 359/581
(Continued)

FOREIGN PATENT DOCUMENTS

CN 87106958 A 7/1988
CN 2938409 Y 8/2007
(Continued)

OTHER PUBLICATIONS

Definition of convex by Dictionary.com, website http://dictionary.reference.com/browse/convex, accessed Aug. 12, 2015, (p. 1).*
(Continued)

*Primary Examiner* — Michael Y Sun
(74) *Attorney, Agent, or Firm* — Birch, Stewart, Kolasch & Birch, LLP

(57) ABSTRACT

A solar cell module is discussed. The solar cell module is defined with an effective area and a dead area, and includes a solar cell, and a substrate disposed at one surface of the solar cell. The substrate includes a light refraction pattern formed to correspond to the dead area.

10 Claims, 21 Drawing Sheets

(51) Int. Cl.
  *H01L 31/048* (2014.01)
  *H01L 31/054* (2014.01)
  *H01L 31/068* (2012.01)
  *H01L 51/52* (2006.01)
  *H01L 33/44* (2010.01)
  *H01L 21/027* (2006.01)
  *G09G 3/36* (2006.01)

(52) U.S. Cl.
  CPC ........ *H01L 31/0543* (2014.12); *H01L 31/068* (2013.01); *H01L 31/0684* (2013.01); *G09G 3/3696* (2013.01); *H01L 21/0276* (2013.01); *H01L 31/054* (2014.12); *H01L 33/44* (2013.01); *H01L 51/5268* (2013.01); *H01L 51/5271* (2013.01); *H01L 51/5275* (2013.01); *Y02E 10/52* (2013.01); *Y02E 10/547* (2013.01)

(58) Field of Classification Search
  CPC ............. H01L 51/5268; H01L 51/5271; H01L 51/5275; H02G 3/00; B21D 47/00; H02S 40/22; G09G 3/3696; Y02E 10/52; Y02E 10/547
  See application file for complete search history.

(56) References Cited

U.S. PATENT DOCUMENTS

| | | | | |
|---|---|---|---|---|
| 4,191,593 | A * | 3/1980 | Cacheux | H01L 31/0725 136/246 |
| 4,711,972 | A * | 12/1987 | O'Neill | 136/246 |
| 5,098,482 | A * | 3/1992 | Warfield | 136/259 |
| 5,554,229 | A * | 9/1996 | Vogeli | 136/259 |
| 2008/0072956 | A1* | 3/2008 | Sharma | H01L 31/02168 136/256 |
| 2008/0276982 | A1* | 11/2008 | Jordan et al. | 136/246 |
| 2009/0025777 | A1* | 1/2009 | Varaprasad | C03C 17/02 136/243 |
| 2009/0114279 | A1* | 5/2009 | Zhao | H01L 31/048 136/256 |
| 2009/0242013 | A1* | 10/2009 | Taguchi | 136/246 |
| 2010/0139740 | A1* | 6/2010 | Xavier | H01L 31/02167 136/251 |
| 2010/0269891 | A1* | 10/2010 | Kinard et al. | 136/251 |
| 2011/0048504 | A1* | 3/2011 | Kinard et al. | 136/251 |
| 2011/0126877 | A1* | 6/2011 | Kim et al. | 136/244 |
| 2011/0139231 | A1* | 6/2011 | Meier et al. | 136/255 |
| 2011/0155210 | A1* | 6/2011 | Kim | H01L 31/02168 136/246 |
| 2011/0174369 | A1* | 7/2011 | Hovel | G02B 1/113 136/256 |
| 2011/0297207 | A1* | 12/2011 | Ishihara et al. | 136/246 |
| 2012/0118352 | A1* | 5/2012 | Asami | 136/246 |
| 2012/0229911 | A1* | 9/2012 | Rodriguez-Parada et al. | 359/642 |
| 2012/0247532 | A1* | 10/2012 | Liu | H01L 31/0543 136/246 |
| 2012/0291846 | A1 | 11/2012 | Mikami et al. | |

FOREIGN PATENT DOCUMENTS

| | | |
|---|---|---|
| CN | 102714235 A | 10/2012 |
| DE | 202011001642 U1 | 4/2011 |
| EP | 2341548 A2 | 7/2011 |
| JP | 2001-313404 A | 11/2001 |
| JP | 2006-41168 A | 2/2006 |
| JP | 2010-192468 A | 9/2010 |
| JP | 2011-37967 A | 2/2011 |
| JP | 2012-523688 A | 10/2012 |
| KR | 10-2009-0099370 A | 9/2009 |
| KR | 10-0934358 B1 | 12/2009 |
| KR | 10-0993512 B1 | 11/2010 |
| KR | 20-2012-0000592 U | 1/2012 |
| KR | 10-2013-0064658 A | 6/2013 |
| WO | WO 2009/075195 A1 | 6/2009 |
| WO | WO 2011/124764 A1 | 10/2011 |

OTHER PUBLICATIONS

"IOR / Index of Refraction List—Pixel and Poly" https://pixelandpoly.com/ior.html.*

* cited by examiner (a)                    (b)

(a)

(b)

(c)

SOLAR CELL MODULE

CROSS-REFERENCE TO RELATED APPLICATION

This application claims the priority benefit of Korean Patent Application Nos. 10-2012-0117783 filed on Oct. 23, 2012 and 10-2013-0022148 filed on Feb. 28, 2013 in the Korean Intellectual Property Office. The disclosures of all these applications are incorporated herein by reference.

BACKGROUND OF THE INVENTION

1. Field of the Invention

The embodiments of the invention relate to a solar cell module, and more particularly to a solar cell module having an improved structure.

2. Description of the Related Art

Recently, as existing energy resources such as petroleum and coal are expected to be depleted, interest in alternative energy sources is increasing. In particular, a solar cell which directly converts solar energy into electric energy is highlighted as a next-generation alternative energy source.

Such a solar cell may be formed by forming conductive regions in a semiconductor substrate, and forming electrodes on the semiconductor substrate, to be electrically connected to respective conductive regions. For enhanced characteristics of the solar cell, a passivation film for passivation of the conductive regions and an anti-reflective film for anti-reflection are additionally formed.

In a conventional solar cell, however, it is difficult to sufficiently utilize light incident upon the solar cell. For this reason, the solar cell exhibits degraded efficiency. To this end, it is required to design a solar cell exhibiting greater efficiency.

SUMMARY OF THE INVENTION

Therefore, the embodiments of the invention have been made in view of the above problems, and it is an object of the embodiments of the invention to provide a solar cell module capable of minimizing light loss, thereby achieving an enhancement in efficiency.

In accordance with an aspect of the invention, the above and other objects can be accomplished by the provision of a solar cell module defined with an effective area and a dead area, the solar cell module including a solar cell, and a substrate disposed at one surface of the solar cell, the substrate including a light refraction pattern formed to correspond to the dead area.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF THE EMBODIMENTS

Figure 1:
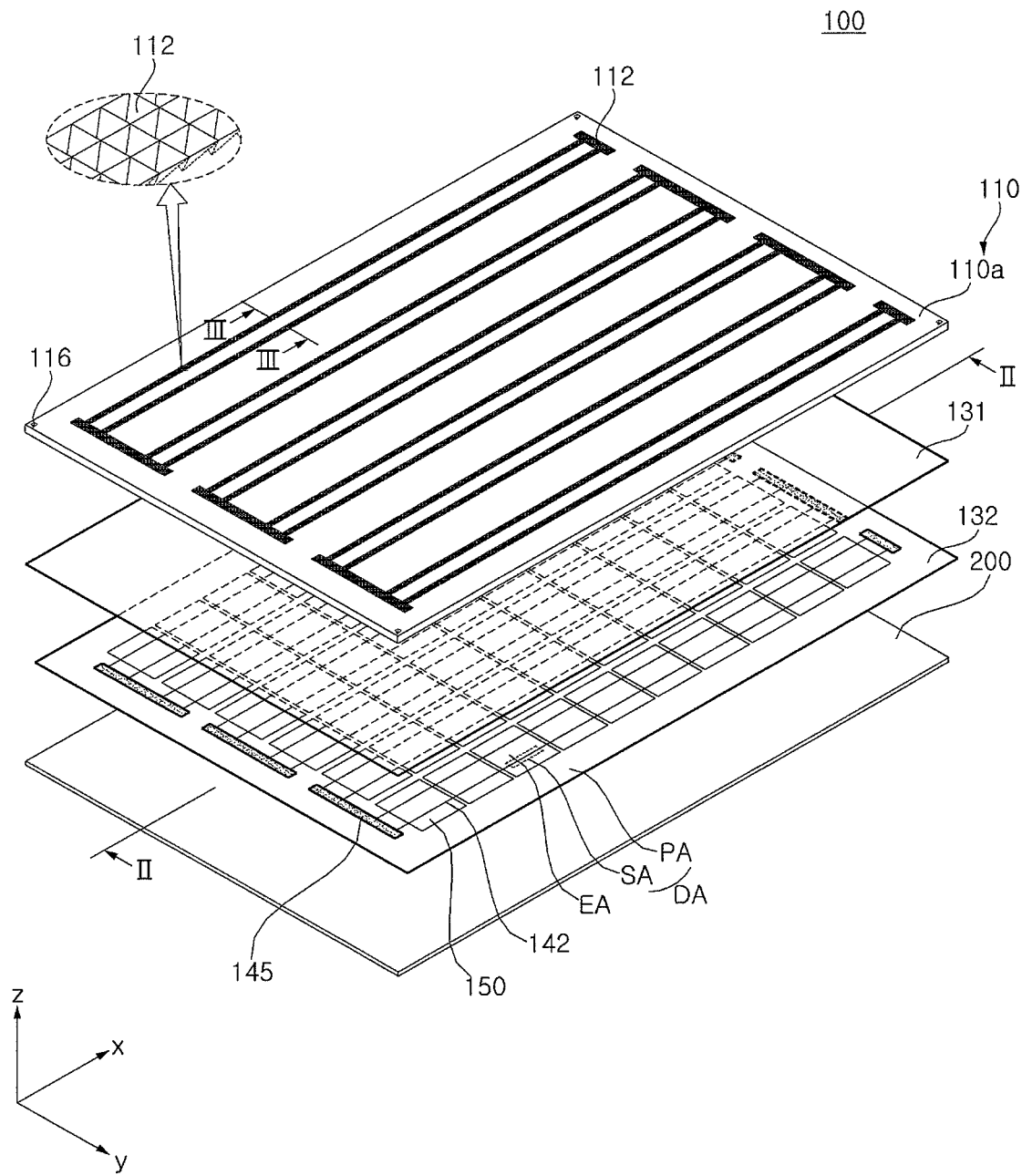
FIG. 1 is an exploded perspective view of a solar cell module according to an example embodiment of the invention.

Reference will now be made in detail to the embodiments of the invention, examples of which are illustrated in the accompanying drawings. These embodiments are not intended to limit the invention. Other embodiments may also be provided.

Constituent elements other than elements constituting essential features of the invention may be omitted from the drawings, for clarity of description. Like reference numerals refer to like elements throughout. In the drawings, the widths, thicknesses, etc., of constituent elements may be exaggerated or reduced for clarity and convenience of illustration. The embodiments of the invention are not limited to the illustrated thicknesses, widths, etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the embodiments, it will be understood that when a layer (or film), a region, a pad, a pattern or a structure is referred to as being disposed 'on/above/over' another layer, region, pad, pattern or substrate, it can be directly in contact with another layer, region, pad, pattern or substrate, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Figure 2:
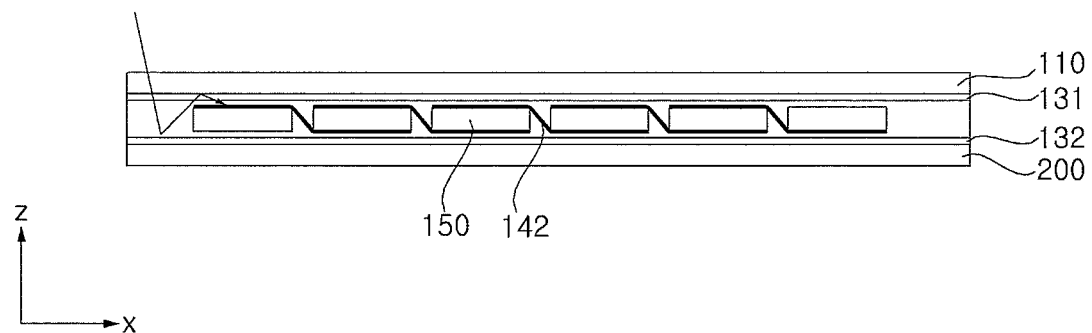
FIG. 2 is a cross-sectional view of the solar cell module taken along line II-II of FIG. 1.

FIG. 1 is an exploded perspective view of a solar cell module according to an example embodiment of the invention. FIG. 2 is a cross-sectional view of the solar cell module taken along line II-II of FIG. 1.

Referring to FIGS. 1 and 2, the solar cell module according to an embodiment of the invention, which is designated by reference numeral "100", may include solar cells 150, a first substrate 110 disposed at the front of the solar cells 150 (hereinafter, referred to as a "front substrate"), and a second substrate 200 disposed at the rear of the solar cells 150 (hereinafter, referred to as a "rear substrate"). The solar cell module 100 may also include a first seal layer 131 interposed between the solar cells 150 and the front substrate 110, and a second seal layer 132 interposed between the solar cells 150 and the rear substrate 200.

Each solar cell 150 includes a photoelectric conversion element for converting solar energy into electric energy, and an electrode electrically connected to the photoelectric conversion element. In the illustrated embodiment of the invention, for example, a photoelectric conversion element including a semiconductor substrate and an impurity layer may be employed. A concrete structure of the photoelectric conversion element will be described later with reference to FIG. 3. Of course, the embodiments of the invention are not limited to the above-described structure. For example, the photoelectric conversion element may have various structures using a chemical semiconductor or a dye-sensitized material.

Each solar cell 150 includes a ribbon 142. Accordingly, the solar cells 150 may be electrically connected in a serial, parallel or serial/parallel fashion. In detail, the ribbon 142 of each solar cell 150 may connect a front electrode formed on a light receiving surface of the solar cell 150 and a rear electrode formed on a back surface of another solar cell 150 arranged adjacent to the former solar cell 150, through a tabbing process. The tabbing process may be carried out by coating a flux on one surface of the solar cell 150, positioning the ribbon 142 on the flux-coated solar cell 150, and curing the resultant structure. The flux is employed to remove an oxide film interfering with soldering. Such a flux may be omitted as needed or desired.

The plural solar cells 150 may be connected in serial or in parallel by interposing a conductive film between one surface of each solar cell 150 and the ribbon 142 of the solar cell 150, and then heat-pressing the resultant structure. The conductive film may be a film made of epoxy resin, acryl resin, polyimide resin, polycarbonate resin or the like while having conductive particles of gold, silver, nickel, copper or the like dispersed therein to impart excellent conductivity. When the conductive film is pressed under the condition that heat is applied to the conductive film, the conductive particles may be exposed outwardly of the film and, as such, the ribbon 142 may be electrically connected to associated ones of the solar cells 150. When plural solar cells 150 are connected by conductive films as described above, to form a modular structure, it may be possible to lower a process temperature. As a result, bending of the solar cells 150 may be avoided.

In addition, bus ribbons 145 alternately connect ribbon ends of adjacent lines of the solar cells 150 connected by the ribbons 142. Each bus ribbon 145 may be arranged at adjacent ends of the adjacent solar cell lines in a direction crossing the adjacent ends. The bus ribbons 145 are connected to a junction box, which process electricity generated by the solar cells 150 while preventing backward flow of electricity.

The first seal layer 131 may be disposed on the light receiving surfaces of the solar cells 150, whereas the second seal layer 132 may be disposed on the back surfaces of the solar cells 150. The first seal layer 131 and second seal layer 132 are bonded through lamination, to block moisture or oxygen causing interference in the solar cells 150 while allowing chemical coupling of elements of the solar cells 150.

The first seal layer 131 and second seal layer 132 may be made of ethylene vinyl acetate copolymer resin, polyvinyl butyral, silicon resin, ester-based resin, olefin-based resin or the like. Of course, the embodiments of the invention are not limited to such materials. The first and second seal materials 131 and 132 may be formed, using various materials other than the above-described materials, in accordance with methods other than lamination.

The front substrate 110 is disposed on the first seal layer 131, to allow sunlight to pass therethrough. In order to protect the solar cells 150 from external impact or the like, the front substrate 110 may include a transparent substrate portion 110a made of glass (for example, tempered glass). More preferably, the transparent substrate portion 110a is made of low-iron tempered glass in order to prevent or reduce reflection of sunlight while achieving an enhancement in optical transmittance. In the illustrated embodiment of the invention, light refraction patterns 112 are formed at predetermined regions on the front substrate 110, to minimize loss of light. This will be described later with reference to FIG. 3 and other drawings.

The rear substrate 200 is a layer for protecting the solar cells 150 at the side of the back surfaces of the solar cells 150. The rear substrate 200 has waterproofing, insulation, and ultraviolet light blocking functions. The rear substrate 200 may take the form of a film or a sheet. For example, the rear substrate 200 may be of a tedlar/PET/tedlar (TPT) type. Of course, the embodiments of the invention are not limited to such a structure. For example, the rear substrate 200 may be made of a material having high rigidity.

The rear substrate 200 may be made of a material exhibiting excellent reflectance in order to reflect sunlight incident thereupon from the side of the front substrate 110, for re-utilization of the reflected light. Of course, the embodiments of the invention are not limited to such a material. For example, the rear substrate 200 may be made of a transparent material capable of transmitting sunlight and, as such, a bifacial solar cell module may be realized.

Hereinafter, detailed structures of the solar cells 150 and front substrate 110 according to the illustrated embodiment of the invention will be described with reference to FIGS. 3 to 5. Configurations other than those of the solar cells 150 and front substrate 110 have already been described and, as such, no detailed description thereof will be given.

Figure 3:
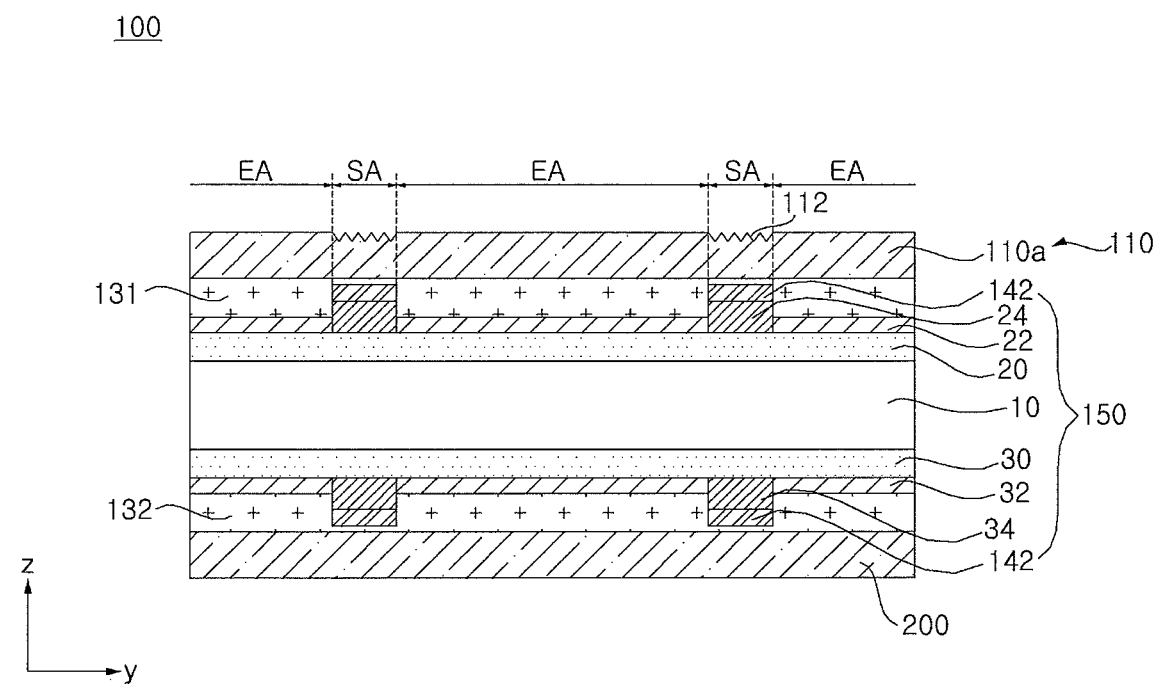
FIG. 3 is a cross-sectional view of the solar cell module taken along line III-III of FIG. 1.
Figure 4:
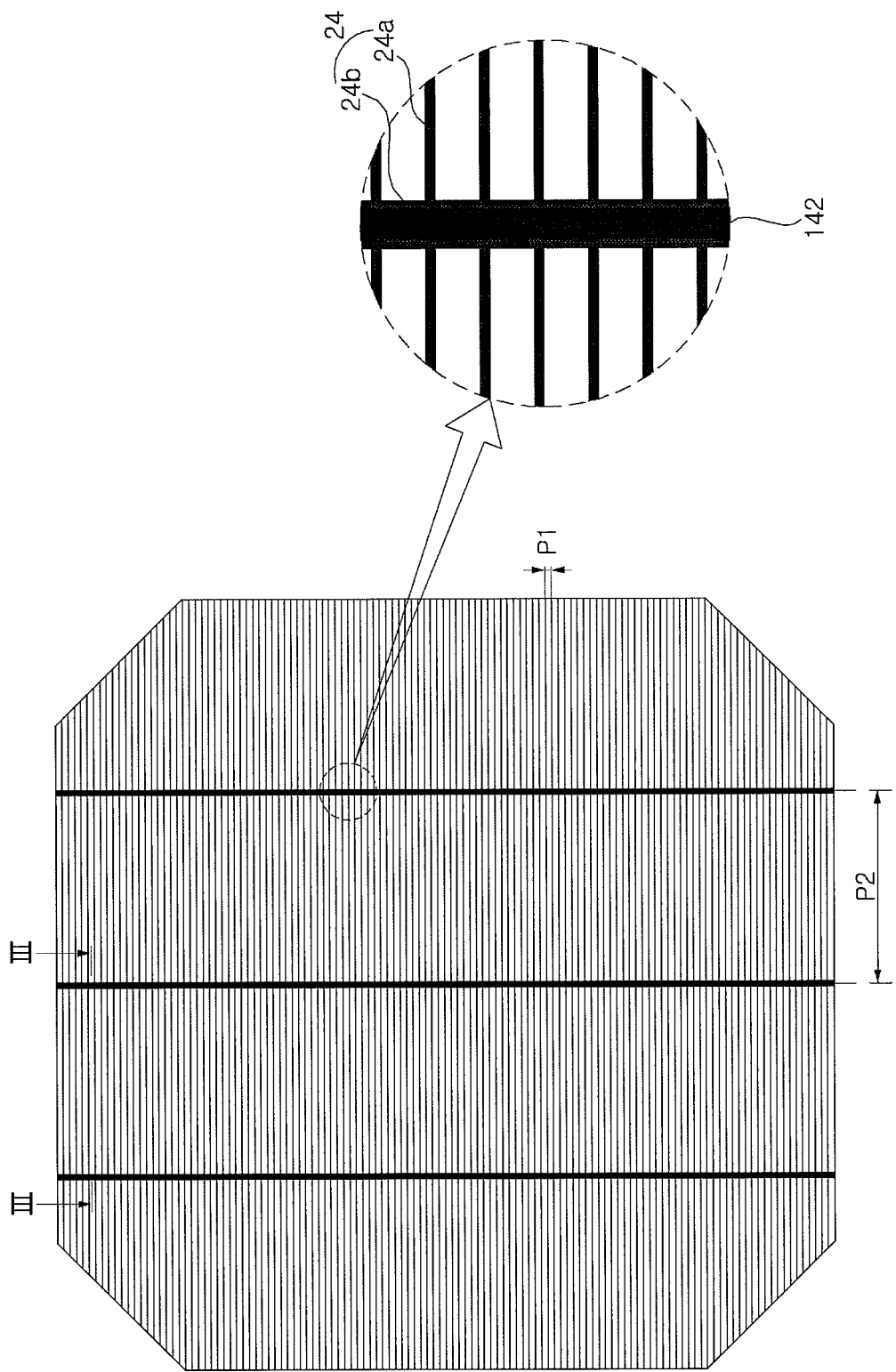
FIG. 4 is a plan view illustrating front surfaces of solar cells illustrated in FIG. 1.

FIG. 3 is a cross-sectional view of the solar cell module taken along line III-III of FIG. 1. FIG. 4 is a plan view illustrating front surfaces of the solar cells illustrated in FIG. 1.

Referring to FIG. 3, each solar cell 150 according to the illustrated embodiment of the invention includes a photoelectric conversion element having layers 10, 20, and 30, and electrodes 24 and 34 electrically connected to the photoelectric conversion element. The structure of the solar cell 150, which will be described later, is purely illustrative and, as such, the embodiments of the invention are not limited thereto. Therefore, as described above, solar cells having various structures may be implemented.

In more detail, the solar cell 150 according to the illustrated embodiment of the invention may include a semiconductor substrate 10, impurity layers 20 and 30 formed in the semiconductor substrate 10, and the electrodes 24 and 34, which are electrically connected to the impurity layers 20 and 30, respectively. The impurity layers 20 and 30 may include an emitter layer and a back surface field layer, respectively. The emitter layer and back surface field layer will be designated by reference numerals 20 and 30, respectively. The electrodes 24 and 34 may include a first electrode electrically connected to the emitter layer 20, and a second electrode 34 electrically connected to the back surface field layer 30. The first and second electrodes will be designated by reference numerals 24 and 34, respectively. The ribbon 142, which is provided at the solar cell 150, is connected to the first electrode 24 or second electrode 34, to connect the solar cell 150 to an adjacent solar cell 150. The solar cell 150 may further include an anti-reflective film 22, a passivation film 32, etc. This will be described in more detail.

The semiconductor substrate 10 may include various semiconductor materials. For example, the semiconductor substrate 10 may include silicon containing impurities of a second conductivity type. For silicon, monocrystalline silicon or polycrystalline silicon may be used. The second conductivity type may be an n type. That is, the semiconductor substrate 10 may be made of monocrystalline or polycrystalline silicon doped with a group-V element such as phosphorous (P), arsenic (As), bismuth (Bi), or antimony (Sb).

When the semiconductor substrate 10 has n-type conductivity, the emitter layer 20 formed at the front surface of the semiconductor substrate 10 has a p-type conductivity and, as such, a pn junction is formed. When the pn junction is irradiated with light, electrons generated in accordance with the photoelectric effect migrate toward the back surface of the semiconductor substrate 10, to be collected by the second electrode 34. Meanwhile, holes generated in accordance with the photoelectric effect migrate toward the front surface of the semiconductor substrate 10, to be collected by the first electrodes 24. As a result, electric energy is generated. Then, holes having a lower migration velocity than electrons do not migrate toward the back surface of the semiconductor substrate 10, instead migrating toward the front surface of the semiconductor substrate 10. Thus, an enhancement in conversion efficiency is achieved.

Of course, the embodiments of the invention are not limited to the above-described structure. The semiconductor substrate 10 and back surface field layer 20 have the p-type conductivity, whereas the emitter layer 20 may have the n-type conductivity.

The front surface and/or back surface of the semiconductor substrate 10 may be provided with irregularities having a pyramid-shaped pattern in accordance with a texturing process. When the semiconductor substrate 10 has increased surface roughness in accordance with formation of irregularities over, for example, the front surface thereof, it is possible to reduce the reflectance of the front surface of the semiconductor substrate 10. Accordingly, it is possible to increase the amount of light reaching the pn junction formed at an interface between the semiconductor substrate 10 and the emitter layer 20, and thus to minimize light loss.

The emitter layer 20 formed at the front surface of the semiconductor substrate 10 contains impurities of a first conductivity type. The emitter layer 20 may contain, as the first-conductivity type impurities, p-type impurities including a group-III element such as boron (B), aluminum (Al), gallium (Ga), and indium (In).

The anti-reflective film 22 and first electrode 24 may be formed on the semiconductor substrate 10, in more detail, on the emitter layer 20 at the front surface of the semiconductor substrate 10.

The anti-reflective film 22 may be substantially formed over the entirety of the front surface of the semiconductor substrate 10, except for a region where the first electrode 24 is formed. The anti-reflective film 22 reduces the reflectance of light incident through the front surface of the semiconductor substrate 10. The anti-reflective film 22 may also function to inactivate defects present in the surface or bulk of the emitter layer 20.

Through a reduction in reflectance of light incident upon the front surface of the semiconductor substrate 10, it is possible to increase the amount of light reaching the pn junction formed at the interface between the semiconductor substrate 10 and the emitter layer 20. Thus, short-circuit current Isc of the solar cell 150 can be increased. Through inactivation of defects present at the back surface of the semiconductor substrate 10, it may be possible to remove re-combination sites of minority carriers. Thus, it is possible to increase an opening voltage Voc of the solar cell 150. The efficiency of the solar cell 150 may be enhanced through an increase in the opening voltage and short-circuit current of the solar cell 150 by the anti-reflective film 22.

The anti-reflective film 22 may be made of various materials. For example, the anti-reflective film 22 may have a single-layer film structure formed by one film selected from the group essentially consisting of a silicon nitride film, a silicon nitride film containing hydrogen, a silicon oxide film, a silicon oxide nitride film, an $MgF_2$ film, a ZnS film, a $TiO_2$ film, and a $CeO_2$ film or may have a multi-layer structure formed by a combination of two or more films selected from the group. Of course, the embodiments of the invention are not limited to such a material and, as such, the anti-reflective film 22 may contain various materials. A front passivation film may further be provided between the semiconductor substrate 10 and the anti-reflective film 22, for passivation. This structure also falls within the scope of the embodiments of the invention.

The first electrode 24 is electrically connected to the emitter layer 20 via an opening formed through the anti-reflective film 22 (that is, in accordance with extension of the first electrode 24 through the anti-reflective film 22). The first electrode 24 may be formed to have various shapes, using various materials. This will be described later.

The back surface field layer 30, which contains impurities of the second conductivity type in a higher doping concentration than the semiconductor substrate 10, is formed at the back surface of the semiconductor substrate 10. For the second-conductivity type impurities of the back surface field layer 30, n-type impurities including a group-V element such as phosphorous (P), arsenic (As), bismuth (Bi), or antimony (Sb) may be used.

The passivation film 32 and second electrode 34 may be formed at the back surface of the semiconductor substrate 10.

The passivation film 32 may be substantially formed over the entirety of the back surface of the semiconductor substrate 10, except for a region where the second electrode 34 is formed. The passivation film 32 may inactivate defects present at the back surface of the semiconductor substrate 10, thereby removing re-combination sites of minority carriers. Thus, it is possible to increase the open-circuit voltage of the solar cell 100.

The passivation film 32 may be made of a transparent insulating material, to allow light to pass therethrough. Accordingly, light can be incident upon the back surface of the semiconductor substrate 10 through the passivation film 32 and, as such, the efficiency of the solar cell 150 can be enhanced. The passivation film 32 may have a single-layer film structure formed by one film selected from the group essentially consisting of a silicon nitride film, a silicon nitride film containing hydrogen, a silicon oxide film, a silicon oxide nitride film, an $MgF_2$ film, a ZnS film, a $TiO_2$ film, and a $CeO_2$ film or may have a multi-layer structure formed by a combination of two or more films selected from the group. Of course, the embodiments of the invention are not limited to such structures. The passivation film 32 may include various materials.

The second electrode 34 is electrically connected to the back surface field layer 30 via an opening formed through the passivation film 32 (that is, in accordance with extension of the second electrode 34 through the passivation film 32). The second electrode 34 may be formed to have various shapes, using various materials.

Although the first and second electrodes 24 and 34 may have different widths or pitches, the basic shapes thereof may be similar. Accordingly, the following description will be given mainly in conjunction with the first electrode 24, and no description will be given of the second electrode 34. The following description may be applied in common to the first and second electrodes 24 and 34.

For example, referring to FIG. 4, the first electrode 24 may include a plurality of finger electrodes 24a arranged in parallel while having a first pitch P1. In addition, the first electrode 24 may include a bus bar electrode 24b formed to extend in a direction crossing the finger electrodes 24a. The first electrode 24 may include one bus bar electrode 24b. Alternatively, as shown in FIG. 4, the first electrode 24 may include a plurality of bus bar electrodes 24b arranged in parallel while having a second pitch P2 greater than the first pitch P1. In this instance, each bus bar electrode 24b may have a greater width than each finger electrode 24a. Of course, the embodiments of the invention are not limited to such widths. For example, the bus bar electrode 24b may have the same width as the finger electrode 24a. That is, the shape of each first electrode 24 is only illustrative, and the embodiments of the invention are not limited thereto.

When viewed in cross-section, the finger electrodes 24a and bas bar electrodes 24b may be formed to extend through the anti-reflective film 22 (the passivation film 32 in the case of the second electrode 34). Alternatively, the finger electrodes 24a may extend through the anti-reflective film 22, whereas the bus bar electrodes 24b may be formed on the anti-reflective film 22.

The first and second electrodes 24 and 34 may be formed to have a single-layer or multilayer structure including silver (Ag), nickel (Ni), copper (Cu), aluminum (Al), tin (Sn), zinc (Zn), indium (In), titanium (Ti), gold (Au), or an alloy thereof. Of course, the embodiments of the invention are not limited to such a structure or such a material.

Ribbons 142 are electrically connected to the first and second electrodes 24 and 34 (in particular, the bus bar electrodes 24b), respectively, for connection of the solar cell to adjacent solar cells. The ribbons 142 may be formed to have a single-layer or multilayer structure including silver (Ag), nickel (Ni), copper (Cu), aluminum (Al), tin (Sn), zinc (Zn), indium (In), titanium (Ti), gold (Au), lead (Pb) or an alloy thereof. Of course, the embodiments of the invention not limited to such a structure or such a material.

Additionally referring to FIG. 1, the solar cell module 100 as described above includes an effective area EA where photoelectric conversion occurs in accordance with incidence of light, and a dead area DA where light cannot enter or photoelectric conversion cannot occur in spite of incidence of light. For example, the dead area DA may include a shaded area SA where light cannot enter due to presence of the electrodes 24 and 34, ribbons 142, etc., arranged in the solar cells 150, and a peripheral area PA where no solar cell 150 is disposed and, as such, photoelectric conversion cannot occur even when light enters. The effective area EA includes inner areas of the solar cells 150, except for the shaded areas SA. The light refraction patterns 112 formed on the front substrate 110 correspond to at least a portion of the dead area DA.

Referring to FIGS. 1 and 3, the light refraction patterns 112 are formed to correspond to regions where the ribbons 142 connecting the plural solar cells 150, and the bus ribbons 145 connected to the ribbons 142 are formed. That is, the light refraction patterns 112 may have a shape elongated along the regions where the ribbons 142 and bus ribbons 145 are formed. The ribbons 142 correspond to bus bar electrodes of the electrodes 24 and 34, and form the shaded area SA. As the light refraction patterns 112 are formed to correspond to the shaded area SA, it may be possible to refract light toward the effective area EA by the light refraction patterns 112. Since light incident upon the shaded area SA is refracted toward the effective area EA, light loss may be minimized. As a result, it may be possible to maximize the amount of light utilized in the solar cells 150.

The light refraction patterns 112 may be formed by removing desired portions of the front substrate 110 to have particular shapes. For example, it may be possible to form the light refraction patterns 112 by removing desired portions of the front substrate 110 in accordance with dry etching or wet etching or engraving desired portions of the front substrate 110, using press rollers.

FIG. 1 illustrates the instance in which the light refraction patterns 112 have an inverted pyramid shape. In this instance, light is refracted at an inclined surface of each light refraction pattern 112 inclined from the surface of the front substrate 110 and, as such, may easily be refracted toward the effective area EA. Accordingly, the light refraction patterns 112 function as a concentrator. Thus, light, which is difficult to be utilized for photoelectric conversion due to incidence thereof upon the shaded area SA, may be utilized for photoelectric conversion in accordance with incidence thereof upon the effective area EA through refraction. Thus, light loss may be minimized and, as such, an enhancement in photoelectric conversion efficiency of the solar cells 150 may be achieved.

The light refraction patterns 112 should be aligned with the shaded area SA such that they coincide with each other. To this end, alignment marks 116 may be formed at the front substrate 110, for the above-described alignment. The alignment marks 116 may have various structures, shapes, and materials. For example, the alignment marks 116 may be formed in the same manner as that of the light refraction patterns 112 in the process of forming the light refraction patterns 112. In this instance, the process may be simplified.

Figure 5:
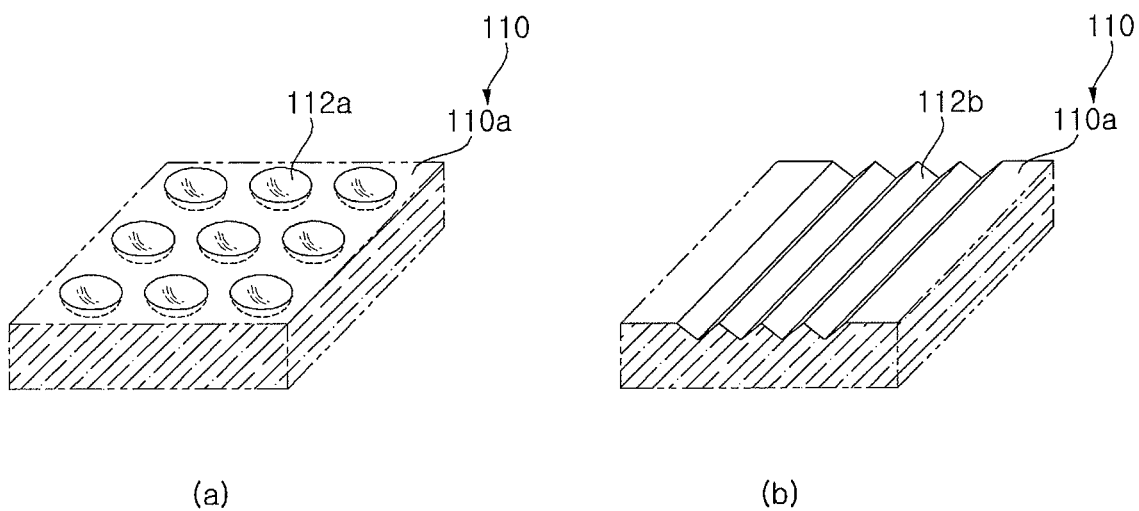
FIG. 5 illustrates, through perspective views, various shapes of irregularities applicable to the solar cell module according embodiments of the invention.

The light refraction patterns 112 may have various shapes capable of refracting light. That is, as illustrated in (a) of FIG. 5, it may be possible to form light refraction patterns 112*a* having a round shape (for example, a hemispherical shape). In this instance, an enhancement in the structural integrity of the front substrate 110*a* is achieved because the light refraction patterns 112*a* do not have a sharp portion. Alternatively, as illustrated in (b) of FIG. 5, it may be possible to form light refraction patterns 112*b* having a prism shape (or groove shape) with a notched cross-section. In this instance, the light refraction patterns 112*b* may efficiently refract light incident upon the shaded area SA toward the effective area EA through a simple structure. Additionally, the light refraction patterns 112 may have various shapes.

In the illustrated embodiments of the invention, the light refraction patterns 112 (e.g., 112*a* and 112*b*) are formed on the transparent substrate portion 110*a* of the front substrate 110. When the light refraction patterns 112 are directly formed on the transparent substrate portion 110*a*, as described above, it is unnecessary to form a separate film. In this instance, accordingly, the light refraction patterns 112 may be easily applied to existing solar cell modules. In particular, since the light refraction patterns 112 are arranged on the outer surface of the front substrate 110, it may be possible to effectively avoid problems occurring at the outer surface of the front substrate 110, for example, reflection.

In the illustrated embodiment of the invention, it may be possible to refract, toward the effective area EA, light incident upon the dead area DA by forming the light refraction patterns 112 in regions of the front substrate 110 corresponding to the dead area DA. Accordingly, an enhancement in the efficiency of the solar cell module 100 may be achieved. In addition, excellent structural stability of the front substrate 110 is secured because the light refraction patterns 112 are not formed over the entire portion of the front substrate 110, but are formed on a portion of the front substrate 110 corresponding to the dead area DA.

Hereinafter, solar cell modules according to other embodiments of the invention will be described with reference to FIGS. 6 to 10. No detailed description will be given of configurations identical or very similar to those of the above-described embodiment. A detailed description will only be given of different configurations. Variations applicable to the above-described embodiment are also applicable to the following embodiments.

Figure 6:
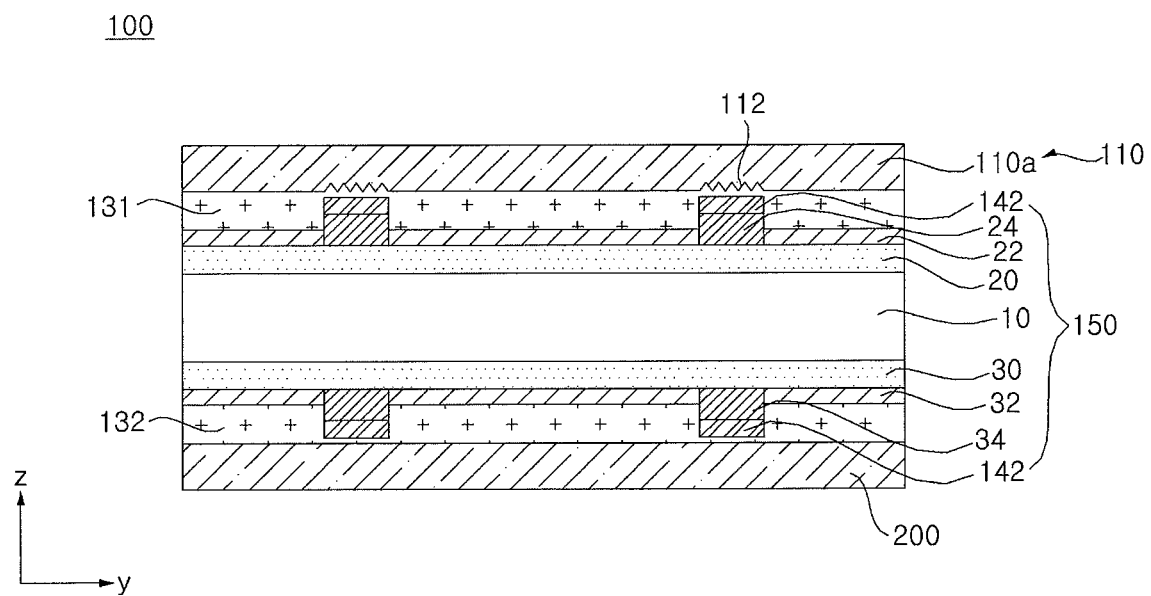
FIG. 6 is a sectional view of a solar cell module according to another embodiment of the invention.

FIG. 6 is a sectional view of a solar cell module according to another embodiment of the invention.

Referring to FIG. 6, in accordance with this embodiment, light refraction patterns 112 are formed at one surface of a front substrate 110 arranged adjacent to solar cells 150 (in particular, an inner surface of a transparent substrate portion 110*a*). When the light refraction patterns 112 are formed at the inner surface of the transparent substrate portion 110*a*, as described above, enhanced structural stability is secured, as compared to the instance in which the light refraction patterns 112 are outwardly exposed. In particular, a first seal layer 131 fills inner portions of the light refraction patterns 112 and, as such, structural stability may be further enhanced.

Figure 7:
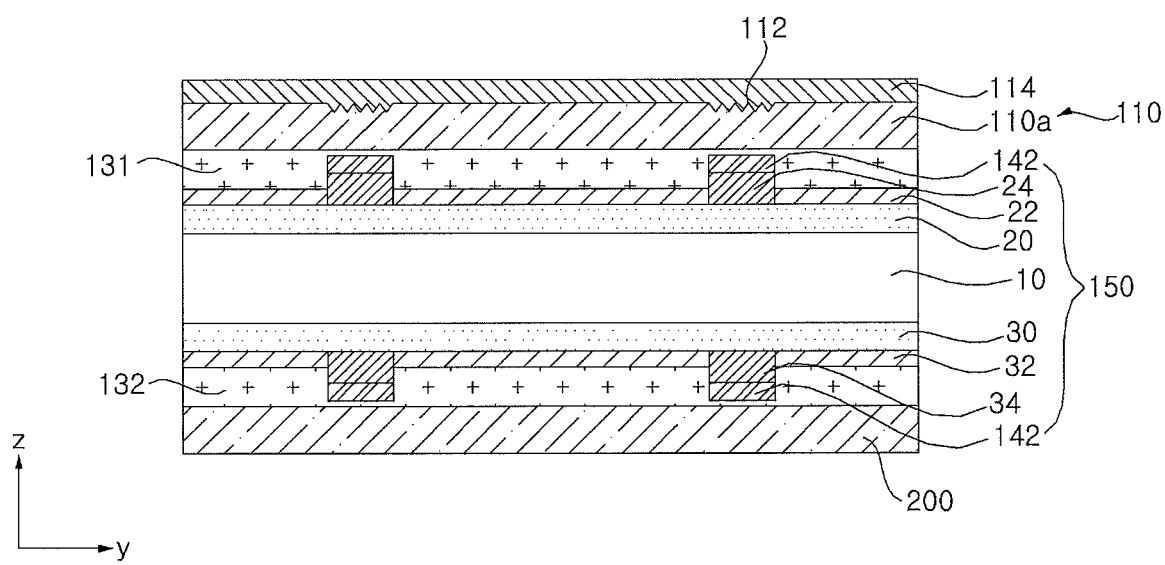
FIG. 7 is a sectional view of a solar cell module according to another embodiment of the invention.

FIG. 7 is a sectional view of a solar cell module according to another embodiment of the invention.

Referring to FIG. 7, in accordance with this embodiment, light refraction patterns 112 are formed at an outer surface of a transparent substrate portion 110*a* constituting a front substrate 110. A protective film 114 may be formed on the transparent substrate portion 110*a*, to cover the light refraction patterns 112. The protective film 114 is formed at the outside of the solar cell module 100 and, as such, may provide enhanced durability when the solar cell module 100 is exposed to external environments. The protective film 114 may include various resins (for example, polyethylene terephthalate). As the protective film 114, an anti-reflective film having an anti-reflection function may be employed in order to obtain anti-reflection characteristics while protecting the solar cell module 100.

Figure 8:
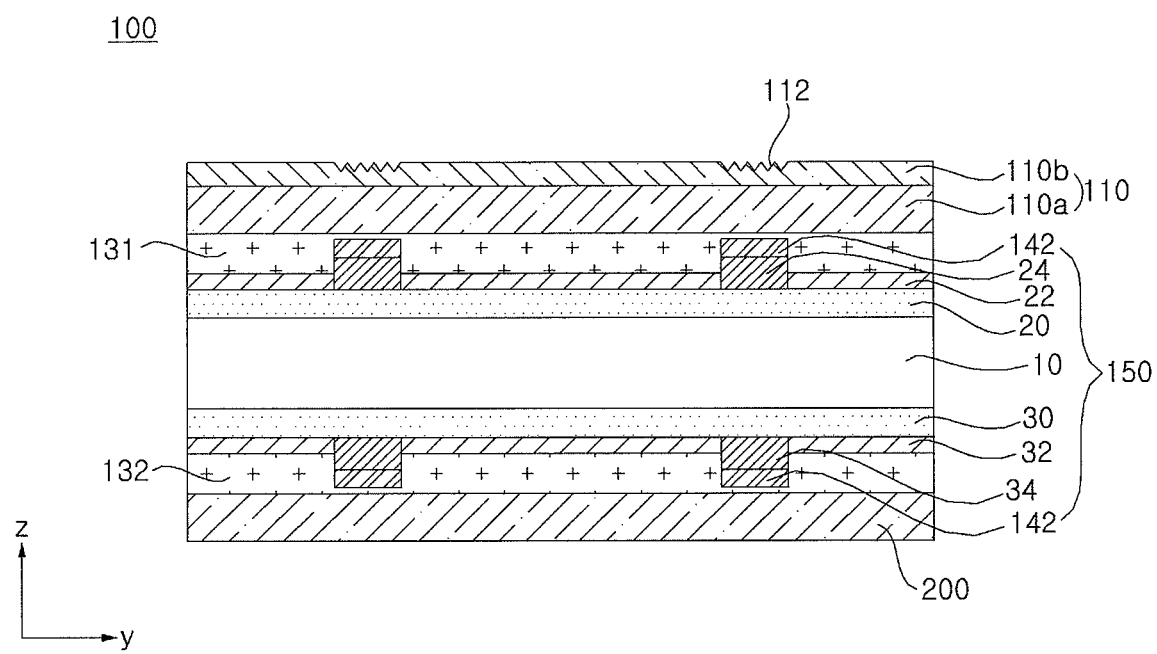
FIG. 8 is a sectional view of a solar cell module according to another embodiment of the invention.

FIG. 8 is a sectional view of a solar cell module according to another embodiment of the invention.

Referring to FIG. 8, in accordance with this embodiment, the solar cell module includes a front substrate 110 including a transparent substrate portion 110*a*, and a light refraction pattern formation film 110*b* formed on the transparent substrate portion 110*a* and provided with light refraction patterns 112. In this embodiment, the light refraction pattern formation film 110*b* is separately provided to form the light refraction patterns 112. In this instance, accordingly, it may be possible to avoid problems occurring when the light refraction patterns 112 are formed at the transparent substrate portion 110*a*, for example, degraded strength thereof.

The light refraction pattern formation film 110*b* may be made of various materials (for example, polyethylene terephthalate). When the front substrate 110 includes a functional material film, the optical refraction films 112 may be formed at the functional material film and, as such, the functional material film may be used as the light refraction film formation film 110*b*. For example, for the light refraction pattern formation film 110*b*, a passivation film, an anti-reflective film or the like may be used. The light refraction pattern formation film 110*b* may be oxide, nitride, or the like.

Figure 9:
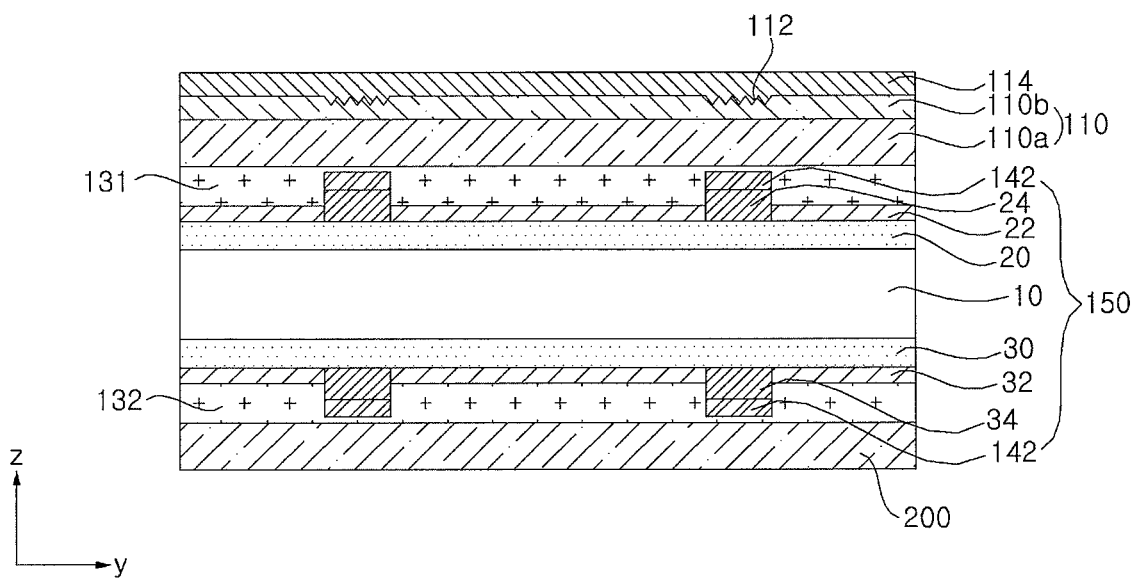
FIG. 9 is a sectional view of a solar cell module according to another embodiment of the invention.

In this instance, the light refraction pattern formation film 110*b*, which may be, for example, an anti-reflective film, may be formed by forming a film in accordance with a coating method or the like, forming the light refraction patterns 112 at the film, and tempering or curing the resultant structure. Additionally, the light reflection pattern formation film 110*b*, which has the light refraction patterns 112, may be formed, using various methods. In this instance, a protective film 114 may be additionally formed to cover the light refraction pattern formation film 110*b*, as illustrated in FIG. 9.

Figure 10:
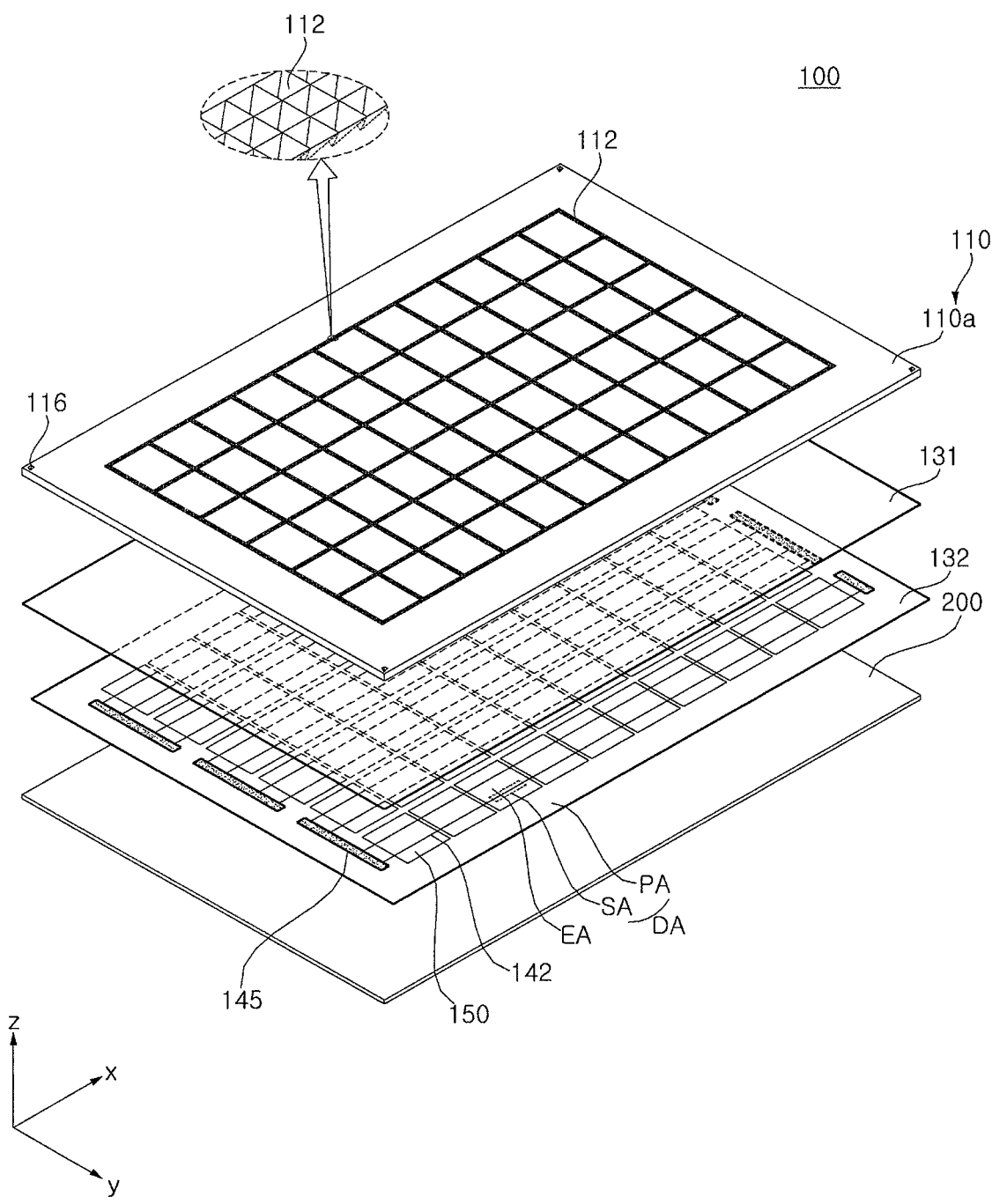
FIG. 10 is a perspective view of a solar cell module according to another embodiment of the invention.

FIG. 10 is a perspective view of a solar cell module according to another embodiment of the invention.

Referring to FIG. 10, in accordance with this embodiment, light refraction patterns 112 are formed along a peripheral area PA of a dead area DA. Accordingly, the light refraction patterns 112 may have a lattice-shaped plane shape in which a plurality of solar cells 150 is disposed within the light refraction patterns 112. In this instance, light incident upon the peripheral area PA is refracted toward insides of the solar cells 150 and, as such, efficiency of the solar cell module 100 may be effectively enhanced. In this instance, the light refraction patterns 112 may also be formed at a shaded area SA of the dead area DA, as illustrated in FIG. 1, in order to further enhance efficiency of the solar cell module 100.

In the above description and drawings, the substrate formed with the light refraction patterns 112 has been described as being the front substrate 110. In this instance, accordingly, it may be possible to minimize light loss at the front substrate 110. However, the embodiments of the invention are not limited to such a condition. For example, when the solar cell module is of a bifacial type, the light refraction patterns 112 may be formed at the rear substrate 200 because light is also incident upon the rear surface of the solar cell module 100. That is, the light refraction patterns 112 may be formed at at least one of the front substrate 110 and rear substrate 200 in the solar cell module 100 in accordance with the embodiments of the invention.

Figure 11:
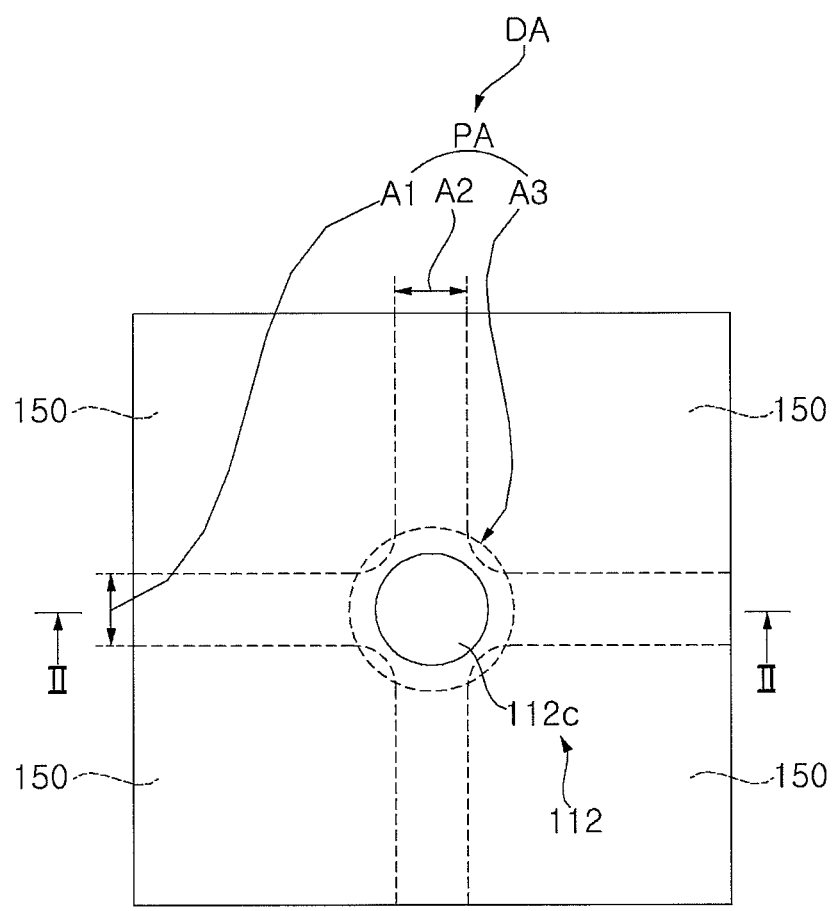
FIG. 11 is a plan view partially illustrating a solar cell module according to another embodiment of the invention.
Figure 12:
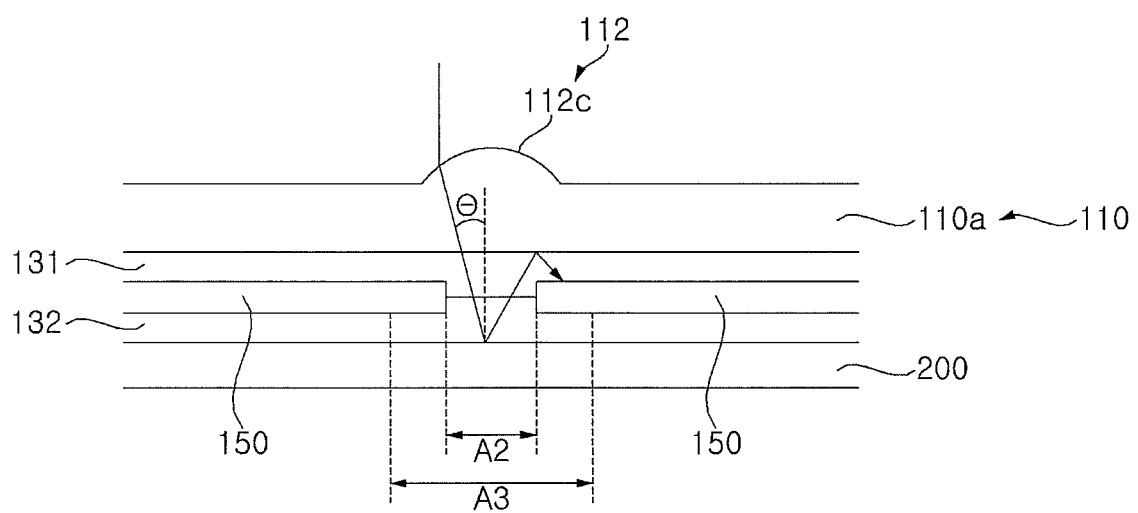
FIG. 12 is a cross-sectional view taken along line II-II of FIG. 11.

FIG. 11 is a plan view partially illustrating a solar cell module according to another embodiment of the invention. FIG. 12 is a cross-sectional view taken along line II-II of FIG. 11.

Referring to FIGS. 11 and 12, the solar cell module according to this embodiment includes a plurality of solar cells 150 arranged in the form of a matrix having a plurality of rows and a plurality of columns while being spaced apart from one another. In this instance, accordingly, the peripheral area PA of the dead area DA in the solar cell module includes first peripheral areas A1 each defined between adjacent ones of the solar cells 150, which are arranged in adjacent ones of the rows of the solar cells 150, respectively, and second peripheral areas A2 each defined between adjacent ones of the solar cells 150, which are arranged in adjacent ones of the columns of the solar cells 150, respectively. The peripheral area PA also includes third peripheral areas A3 respectively defined in spaces where the first peripheral areas A1 and second peripheral areas A2 cross each other. That is, each third peripheral area A3 is defined by four adjacent solar cells 150, as illustrated in FIG. 12.

Light refraction patterns 112 formed in this embodiment are illustrated as including third refraction patterns 112c formed at positions overlapping with the third peripheral areas A3, respectively. Of course, the embodiments of the invention are not limited to such a configuration. For example, each light refraction pattern 112 may include at least one of a first refraction pattern formed at a position overlapping with the corresponding first peripheral area A1, a second refraction pattern formed at a position overlapping with the corresponding second peripheral area A2, and a third refraction pattern 112c formed at a position overlapping with the corresponding third peripheral area A3. The first and second refraction patterns will be described in detail later with reference to FIG. 17.

In this embodiment, the third refraction pattern 112c may be disposed at an outer surface of a front substrate 110 (in more detail, an outer surface of a transparent portion 110a constituting the front substrate 110). In this instance, the third refraction pattern 112c is constituted by a protrusion projecting from the outer surface of the front substrate 110 in a direction opposite to an inner surface of the front substrate 110. The third refraction pattern 112c may have a hemispherical lens shape corresponding to the corresponding third peripheral area A3. Accordingly, the third refraction pattern 112c of this embodiment has a circular plane shape. As illustrated in FIG. 12, the third refraction pattern 112c, which has the above-described structure, refracts light incident upon the third peripheral area A3.

This will be described in more detail. Light incident upon the third peripheral area A3 at an angle of incidence of 0°, namely, light vertically incident upon the front substrate 110, is refracted by the third refraction pattern 112c. The refracted light is then incident upon the rear substrate 200 while being inclined at a certain inclination angle θ with respect to the incidence angle of 0°. Accordingly, light reflected from the rear substrate 200 is again reflected from the inner surface of the front substrate 110, and is then incident upon the front surface of the solar cell 150. Thus, the amount of light incident upon the solar cell 150 is increased and, as such, efficiency of the solar cell module is enhanced.

In the above description, the third refraction pattern 112c has been described and illustrated as being disposed at the outer surface of the transparent substrate portion 110a constituting the front substrate 110. However, the embodiments of the invention are not limited to such a condition. Various variations may be applied, as illustrated in FIGS. 6 to 9. In addition, various variations as illustrated in FIGS. 6 to 9 may be applied to various variations of the third refraction pattern, which will be described with reference to FIGS. 13 to 16, and various variations of the first and second refraction patterns, which will be described with reference to FIGS. 17 and 18.

Figure 13:
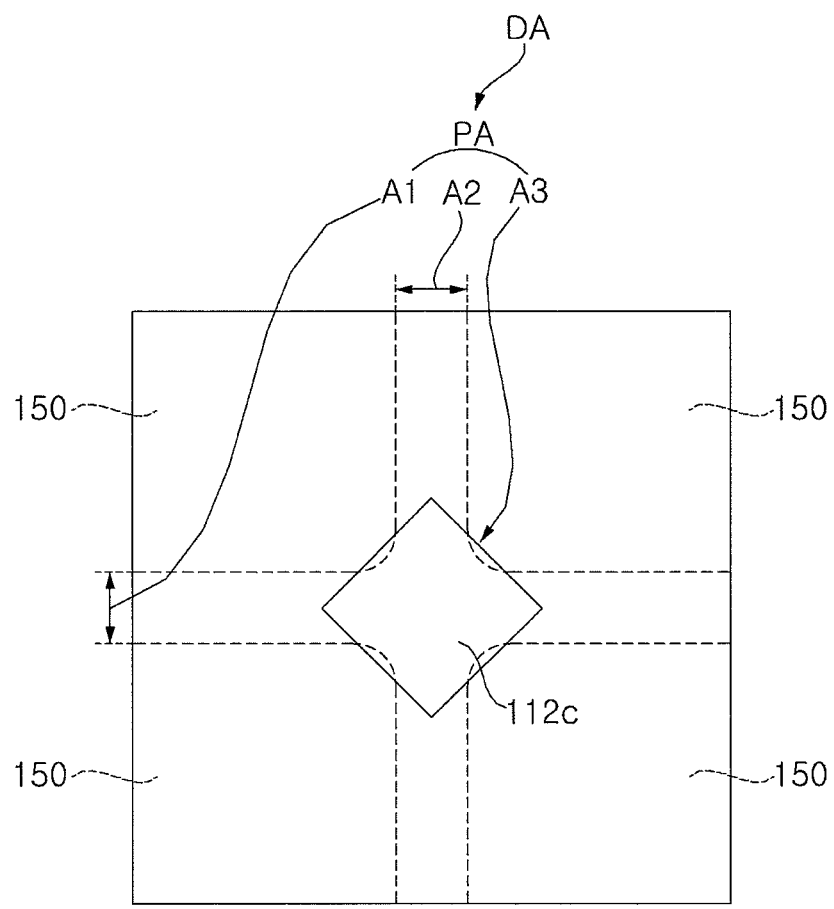
FIG. 13 is a view illustrating a plane shape of a third refraction pattern according to another embodiment of the invention.
Figure 14:
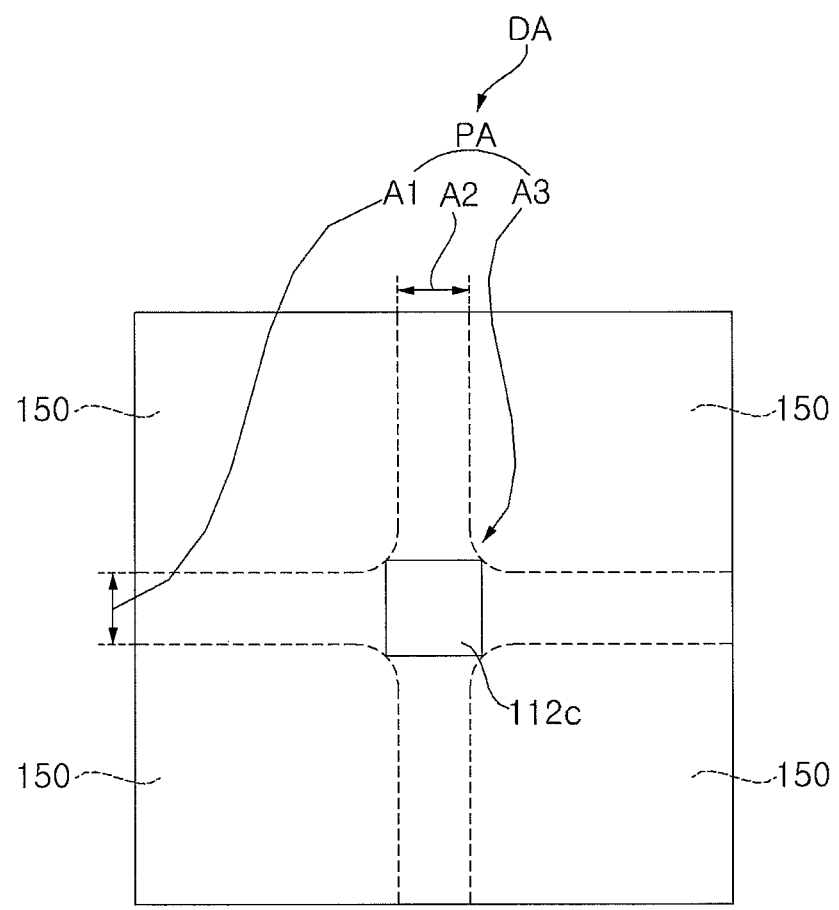
FIG. 14 is a view illustrating a plane shape of a third refraction pattern according to another embodiment of the invention.

The third refraction pattern 112c may have various plane shapes. That is, as illustrated in FIG. 13, the third refraction pattern 112c may have a diamond shape. As illustrated in FIG. 14, the third refraction pattern 112c may have a square shape. Additionally, the third refraction pattern 112c may have various plane shapes. In addition, as illustrated in FIGS. 12 and 14, the third refraction pattern 112c may have a size not overlapping with the corresponding solar cells 150. Alternatively, as illustrated in FIG. 13, the third refraction pattern 112c may partially overlap with corner portions of the corresponding solar cells 150.

Figure 15:
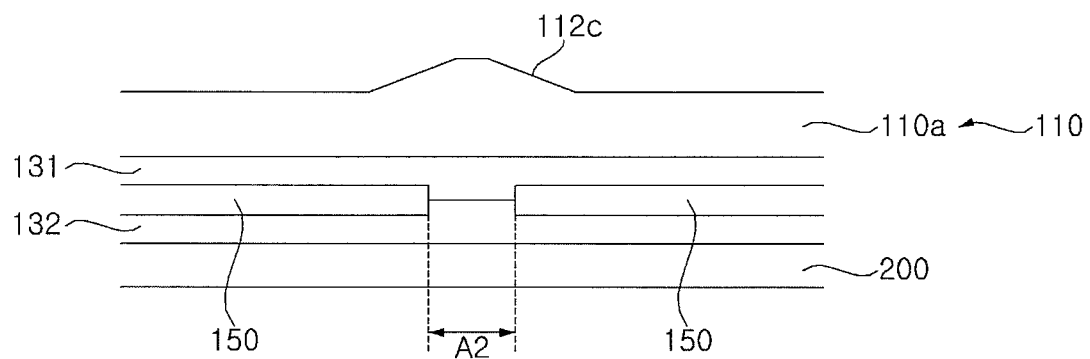
FIG. 15 is a view illustrating a lateral cross-sectional shape of a third refraction pattern according to another embodiment of the invention.
Figure 16:
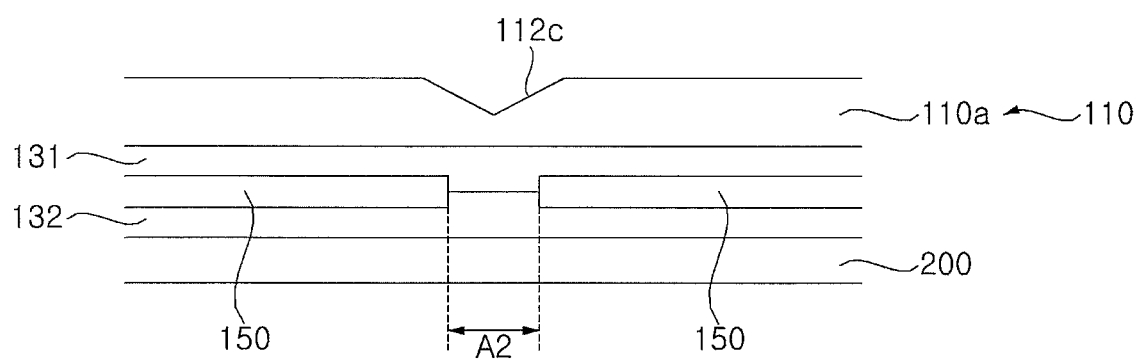
FIG. 16 is a view illustrating a lateral cross-sectional shape of a third refraction pattern according to another embodiment of the invention.

In the above description, the third refraction pattern 112c has been described as being constituted by a protrusion having a hemispherical cross-sectional shape. However, the third refraction pattern 112c may have various shapes. For example, as illustrated in FIG. 15, the third refraction pattern 112c may have a trapezoidal cross-sectional shape. In this instance, the third refraction pattern 112c exhibits enhanced structural stability. Alternatively, as illustrated in FIG. 16, the third refraction pattern 112c may be formed in the form of a groove recessed from the outer surface of the front substrate 110 toward the inner surface of the front substrate 110. In this instance, the third refraction pattern 112c has inclined surfaces at all lateral sides thereof and, as such, light is refracted at all surfaces of the third refraction pattern 112c. Accordingly, the amount of light again utilized via refraction may be increased. In FIG. 16, the third refraction pattern 112c has been illustrated as being constituted by a groove having a triangular cross-sectional shape. However, the embodiments of the present invention are not limited to such a structure. For example, the third refraction pattern 112c may have a trapezoidal cross-sectional shape. Additionally, the third refraction pattern 112c may have various cross-sectional shapes.

Figure 17:
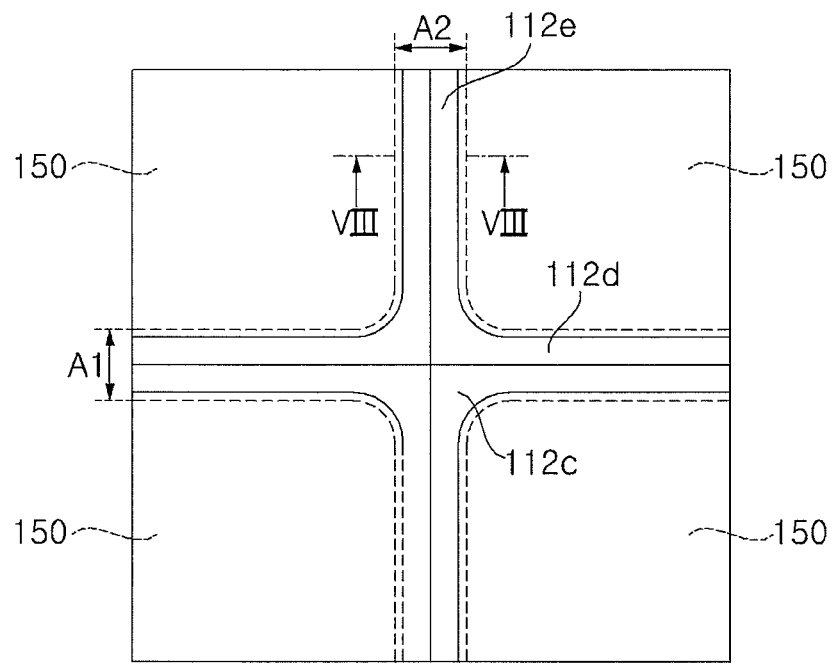
FIG. 17 is a plan view partially illustrating a solar cell module according to another embodiment of the invention.
Figure 18:
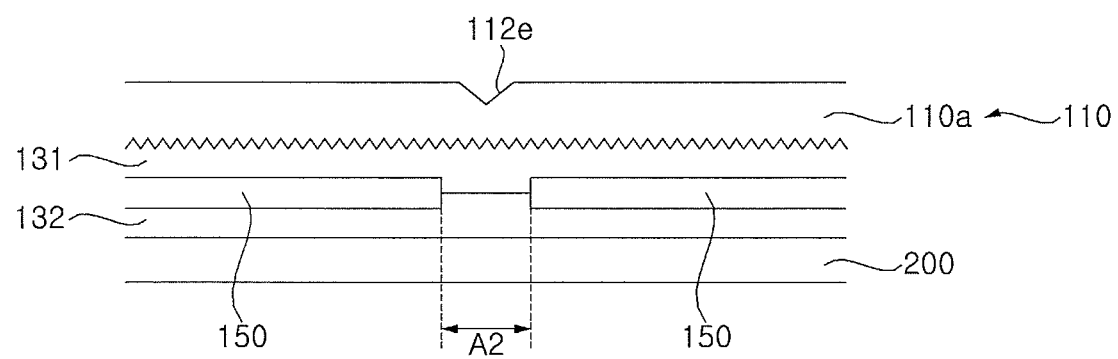
FIG. 18 is a cross-sectional view taken along line VIII-VIII of FIG. 17.

FIG. 17 is a plan view partially illustrating a solar cell module according to another embodiment of the invention. FIG. 18 is a cross-sectional view taken along line VIII-VIII of FIG. 17.

In this embodiment, first refraction patterns 112d, second refraction patterns 112e, and third refraction patterns 112c are formed. Each first refraction pattern 112d is formed at a position overlapping with a corresponding one of first peripheral areas A1 each defined by a space between adjacent ones of the solar cells 150, which are arranged in adjacent ones of the rows of the solar cells 150, respectively. Each second refraction pattern 112e is formed at a position overlapping with a corresponding one of second peripheral areas A2 each defined by a space between adjacent ones of the solar cells 150, which are arranged in adjacent ones of the columns of the solar cells 150, respectively. The third refraction patterns 112c are formed at positions respectively overlapping with third peripheral areas A3 respectively defined in spaces where the first peripheral areas A1 and second peripheral areas A2 cross each other. If necessary, the following description will be given in conjunction with one first refraction pattern 112d, one second refraction pattern 112e, and one third refraction pattern 112c, for convenience of description.

The first and second refraction patterns 112d and 112e may have a linear plane shape while having a triangular cross-sectional shape. Of course, the first and second refraction patterns 112d and 112e may have various cross-sectional shapes, for example, a semicircular shape or a diamond shape, similarly to the above-described third refraction pattern 112c. The first and second refraction patterns 112d and 112e may have a protrusion structure. At least one of the first refraction pattern 112d and second refraction pattern 112e may partially overlap with the corresponding solar cells 150.

In order to avoid an increase in series resistance, the first peripheral areas A1 may have a smaller width that the second peripheral areas A2. Accordingly, the second refraction pattern 112e may have a greater width than the first refraction pattern 112d.

As illustrated in FIG. 17, the first and second refraction patterns 112d and 112e may be connected with the third refraction pattern 112c. Of course, at least one of the first refraction pattern 112d and second refraction pattern 112e may be omitted. In addition, at least one of the first refraction pattern 112d and second refraction pattern 112e may not be connected with the third refraction pattern 112c.

When at least one of the first refraction pattern 112d and second refraction pattern 112e is not connected with the third refraction pattern 112c, the refraction pattern not connected with the third refraction pattern 112c may have a length substantially equal to the length of one side of the solar cell 150.

That is, when the first refraction pattern 112d is not connected with the third refraction pattern 112c, the first refraction pattern 112d may have a length substantially equal to the length of a lower or upper side of the solar cell 150. In addition, in this instance, a plurality of spaced first refraction patterns 112d may be formed in each first peripheral area A1.

On the other hand, when the second refraction pattern 112e is not connected with the third refraction pattern 112c, the second refraction pattern 112e may have a length substantially equal to the length of a left or right side of the solar cell 150. In addition, in this instance, a plurality of spaced second refraction patterns 112e may be formed in each second peripheral area A2.

Meanwhile, the inner surface of the front substrate 110 (in more detail, the transparent substrate portion 110a) may be formed with a textured surface including micro-irregularities. When the inner surface of the front substrate 110 is formed with a textured surface, the amount of light incident upon the solar cells 150 may be further increased by virtue of scattering effects generated at the textured surface.

The first to third refraction patterns 112d, 112e, and 112c may be formed by directly forming grooves or protrusions at glass or resin constituting the front substrate 110. In this instance, the front substrate 110 may have a thickness of 0.8 to 5 mm.

For example, when the front substrate 110 is manufactured, using a process of passing glass or resin through a nip defined between a pair of rollers, patterns for formation of grooves or protrusions may be formed at one of the rollers. In this instance, the first to third refraction patterns 112d, 112e, and 112c may be formed at one surface of the front substrate 110 by the patterned roller when glass or resin passes through the nip between the rollers.

Thus, a separate additional task for formation of the first to third refraction patterns 112d, 112e, and 112c may be eliminated and, as such, the front substrate 110 for the solar cell module may be effectively manufactured.

Figure 19:
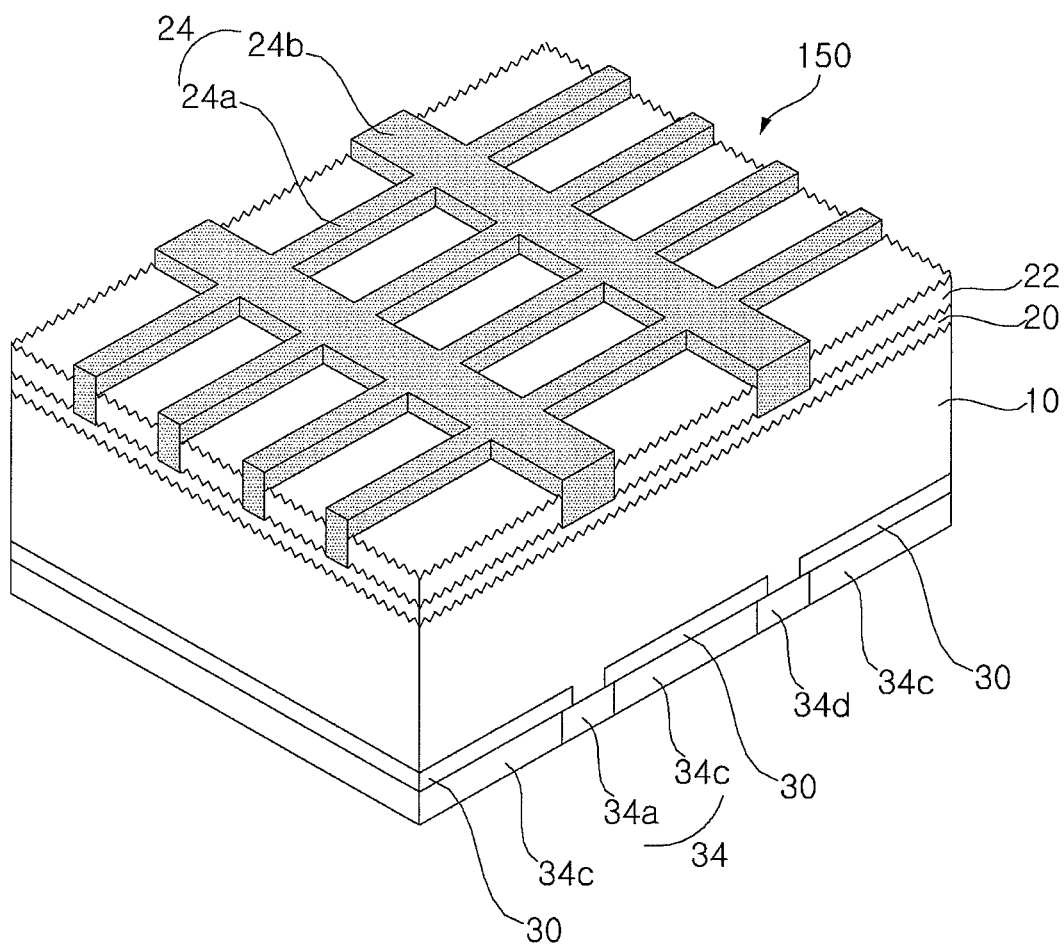
FIG. 19 is a perspective view partially illustrating a solar cell module according to another embodiment of the invention.

When micro-irregularity patterns for formation of a textured surface are formed at the other roller, it may be possible to form a textured surface at the inner surface of the front substrate, simultaneously with formation of the first to third refraction patterns 112d, 112e, and 112c at the outer surface of the front surface. FIG. 19 is a perspective view partially illustrating a solar cell module according to another embodiment of the invention.

Referring to FIG. 19, the solar cell module according to this embodiment is different from those of the above-described embodiments in terms of the structure of the second electrode 34. That is, in this embodiment, the second electrode 34 may include a bus bar electrode 34a, and a rear electrode layer 34c formed over a region where the bus bar electrode 34a is not formed. The rear electrode layer 34c and bus bar electrode 34a may overlap each other. Alternatively, the rear electrode layer 34c and bus bar electrode 34a may be formed such that side surfaces thereof are in contact with each other. A back surface field layer 30 may be formed to correspond to a region where the rear electrode layer 34c is formed. Additionally, various variations may be implemented.

Figure 20:
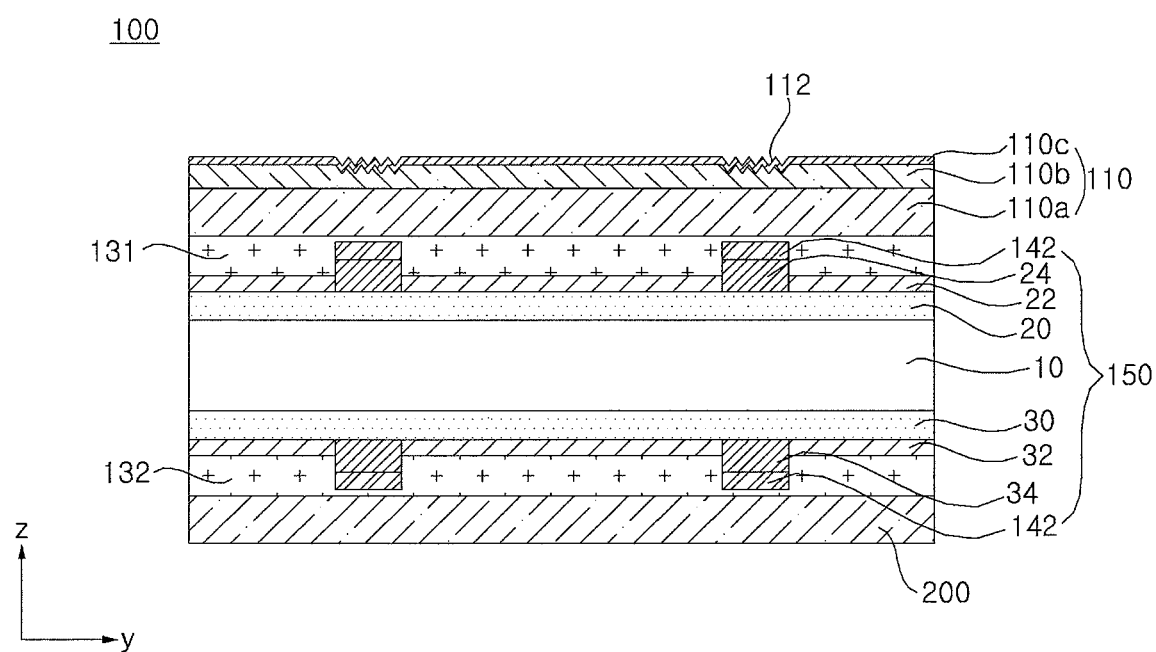
FIG. 20 is a sectional view illustrating a solar cell module according to another embodiment of the invention.
Figure 21:
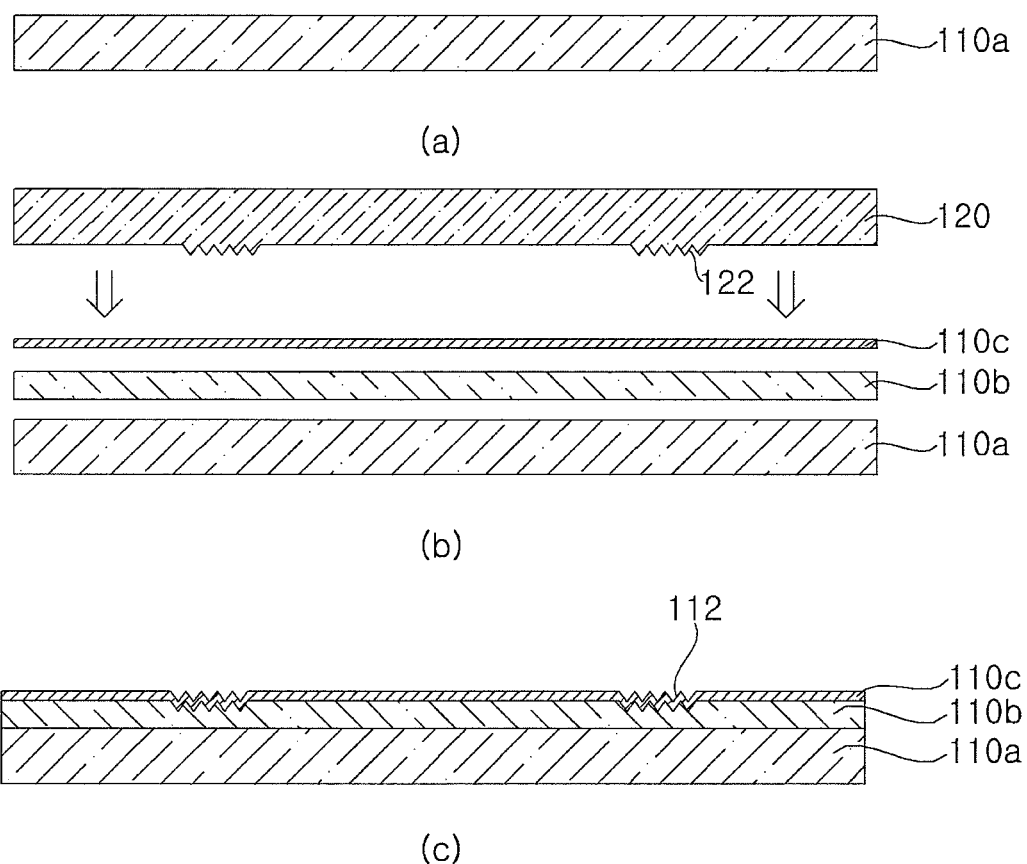
FIG. 21 illustrates sectional views schematically illustrating a process for manufacturing a front substrate of the solar cell module illustrated in FIG. 20.

FIG. 20 is a sectional view illustrating a solar cell module according to another embodiment of the invention. FIG. 21 illustrates sectional views schematically illustrating a process for manufacturing a front substrate of the solar cell module illustrated in FIG. 20.

Referring to FIG. 20, in this embodiment, the front substrate, which is designated by reference numeral "110", includes a transparent substrate portion 110a, and a light refraction pattern formation film 110b formed over the transparent substrate portion 110a while including light refraction patterns 112. The front substrate 110 also includes a protective film 110c. In this embodiment, the light refraction pattern formation film 110b for formation of the light refraction patterns 112 is provided. In this instance, accordingly, it may be possible to avoid problems occurring when the light refraction patterns 112 are formed at the transparent substrate portion 110a, for example, strength degradation in regions where the light refraction patterns 112 are formed. The light refraction pattern formation film 110b may include, for example, a thermoplastic polymer material. In this embodiment, it may be possible to easily and simply form the light refraction pattern formation film 110b and the protective film 110c capable of avoiding contamination of the light refraction pattern formation film 110b by performing formation of the light refraction patterns 112 under the condition that the protective film 110c is disposed on the light refraction pattern formation film 110b.

A process for manufacturing the front substrate 110 having the above-described structure will be described in detail with reference to FIG. 21.

First, the transparent substrate portion 110a is prepared, as illustrated in (a) of FIG. 21.

Thereafter, the light refraction pattern formation film 110b and protective film 110c are disposed on the transparent substrate portion 110a, as illustrated in (b) of FIG. 21. In this state, the light refraction pattern formation film 110b and protective film 110c are heated while being pressed, using a mold 120 including irregularity patterns 122 having a shape corresponding to a desired shape of the light refraction patterns 112.

In accordance with this process, the light refraction pattern formation film 110b, which includes a thermoplastic polymer material, is cured and, as such, the light refraction pattern formation film 110b and protective film 110c are coupled to the transparent portion 110a, to form an integrated structure, as illustrated in (c) of FIG. 21. The light refraction patterns 112 are also formed on the light refraction pattern formation film 110b and protective film 110c.

In accordance with this embodiment, it may be possible to manufacture the front substrate 110 with the light refraction patterns 112, using a simple method. It may also be possible to prevent or reduce the light refraction pattern formation film 110b from being contaminated, by virtue of the protective film 110c. Since the above-described process may be carried out under the condition that the transparent substrate portion 110a is disposed on the solar cells 150, the light refraction patterns 112 may be formed at desired positions and, as such, may have excellent alignment characteristics.

Figure 22:
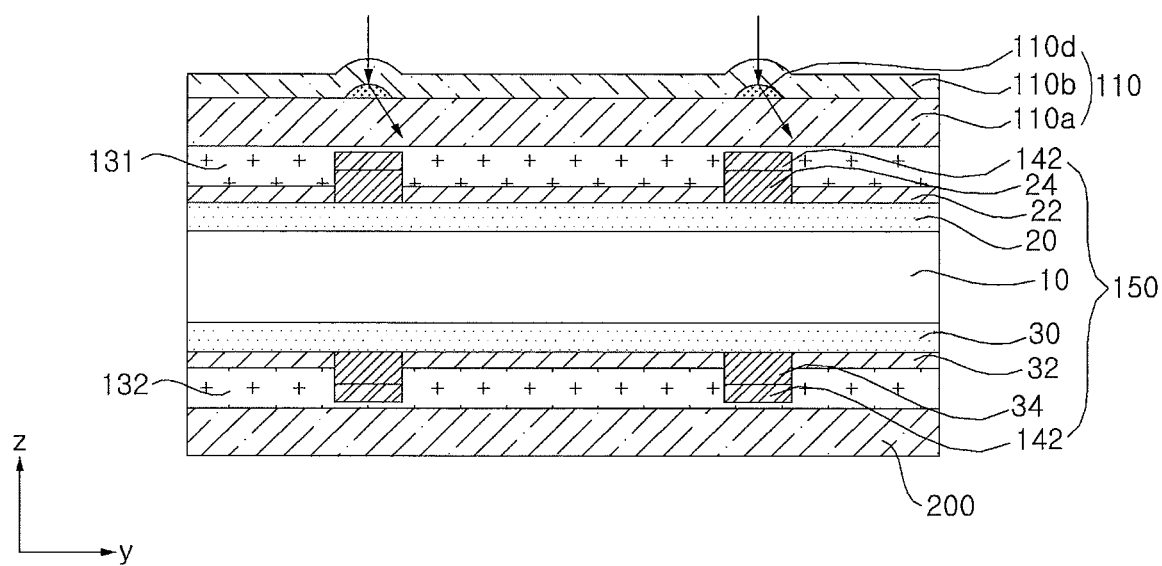
FIG. 22 is a sectional view illustrating a solar cell module according to another embodiment of the invention.
Figure 23:
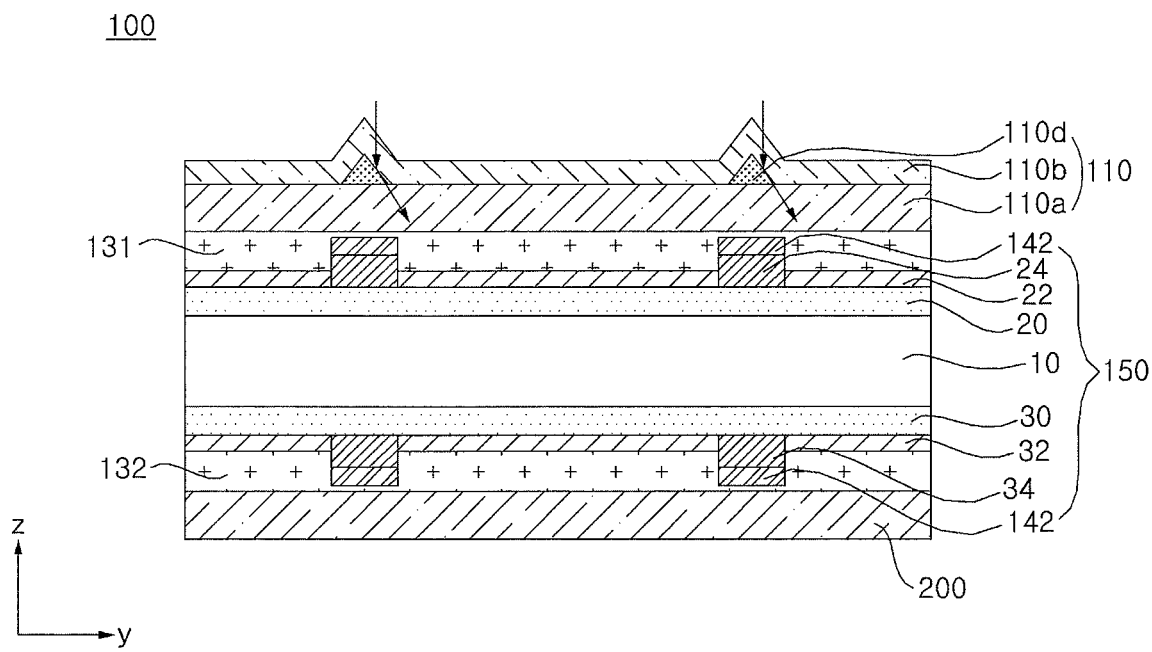
FIG. 23 is a sectional view illustrating a modification of the solar cell module illustrated in FIG. 22.
Figure 24:
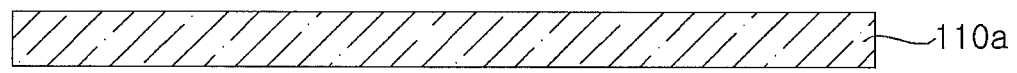
FIG. 24 illustrates sectional views schematically illustrating a process for manufacturing a front substrate of the solar cell module illustrated in FIG. 22.
Figure 24:
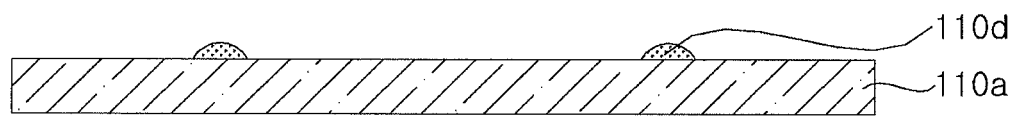
Figure 24:
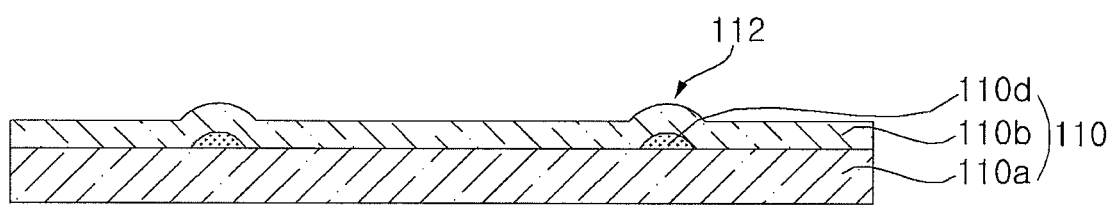

FIG. 22 is a sectional view illustrating a solar cell module according to another embodiment of the invention. FIG. 23 is a sectional view illustrating a modification of the solar cell module illustrated in FIG. 22. FIG. 24 illustrates sectional views schematically illustrating a process for manufacturing a front substrate of the solar cell module illustrated in FIG. 22.

Referring to FIG. 22, in this embodiment, the front substrate, which is designated by reference numeral "110", includes a transparent substrate portion 110a, a light refraction pattern formation film 110b formed over the transparent substrate portion 110a while including light refraction patterns 112, and convex portions disposed between the transparent substrate portion 110a and the light refraction pattern formation film 110b. The convex portions 110d are made of a material exhibiting a refractive index different from that of the light refraction pattern formation film 110b and, as such, it may be possible to more effectively refract light in accordance with the refractive index difference between the convex portions 110d and the light refraction pattern formation film 110b. The convex portions 110d may have various refractive indexes, taking into consideration the positions of the light refraction patterns, a desired light refraction direction, etc. The convex portions 110d are formed to correspond to regions where the light refraction patterns 112 are formed, respectively. The light refraction pattern formation film 110b is formed over the transparent substrate portion 110a, to cover the convex portions 110d. The light refraction pattern formation film 110b may be, for example, an anti-reflective film.

In this embodiment, as described above, the light refraction pattern formation film 110b for formation of the light refraction patterns 112 is provided and, as such, it may be possible to avoid problems occurring when the light refraction patterns 112 are formed at the transparent substrate portion 110a, for example, degraded strength exhibited in regions where the light refraction patterns 112 are formed. It may also be possible to effectively refract light in accordance with a provision of the convex portions 110d having a refractive index different from that of the light refraction pattern formation film 110b. Since the convex portions 110d are formed on selected portions of the transparent substrate portion 110a, and the light refraction pattern formation film 110b is formed to cover the convex portions 110d, the convex portions 110d may be stably disposed between the transparent substrate portion 110a and the light refraction pattern formation film 110b and, as such, may not be separated from the transparent substrate portion 110a even after being exposed to the outside for a prolonged period of time. In this embodiment, the convex portions 110d are illustrated as having a gentle curved surface, to have a round cross-section. However, the embodiments of the invention are not limited to such a structure. For example, as illustrated in FIG. 23, the convex portions 110d may have a triangular cross-section having a width gradually reduced in an outward direction. In this instance, the convex portions 110d may have a prism shape or a pyramid shape. Additionally, the convex portions 110d may have various shapes.

A process for manufacturing the front substrate 110 having the above-described structure will be described in detail with reference to FIG. 24.

First, the transparent substrate portion 110a is prepared, as illustrated in (a) of FIG. 24.

Thereafter, the convex portions 110d are formed on the transparent substrate portion 110a, as illustrated in (b) of FIG. 24. Formation of the convex portions 110d may be achieved, using various methods. For example, screen printing, gravure printing or the like may be used.

Subsequently, the light refraction pattern formation film 110b may be formed over the transparent substrate portion 110a while covering the convex portions 110d, as illustrated in (c) of FIG. 24. As described above, the light refraction pattern formation film 110b may be constituted by an anti-reflective film. In this instance, the light refraction pattern formation film 110b may be formed by coating a material usable for an anti-reflective film, using various methods.

In this embodiment, it may be possible to easily and simply manufacture the front substrate 110, which has a stable structure, through interposition of the convex portions 110d having a refractive index different from those of the transparent substrate portion 110a and light refraction pattern formation film between the transparent substrate portion 110a and the light refraction pattern formation film.

In this embodiment of the invention, the solar cell module 100 has been illustrated as including a plurality of solar cells 150. However, the embodiments of the invention are not limited to such a structure. For example, the solar cell module 100 may include at least one solar cell 150, which may have various structures.

In embodiments of the invention, the light refraction patterns 112 may be locally formed and thus discrete, or may be continuously extending. Also, as shown in various illustrated embodiments, the light refraction patterns 112 may be aligned with the electrodes 24 or 34, or aligned with gaps in between the solar cells 150.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell module comprising:
   a plurality of solar cells which are serially connected with ribbons;

a front substrate disposed at one surface of the plurality of solar cells;

a rear substrate disposed at another surface of the plurality of solar cells;

a first sealing layer disposed between the plurality of solar cells and the front substrate; and a second sealing layer disposed between the plurality of solar cells and the rear substrate, wherein the front substrate comprises:

a transparent glass having a first surface facing the plurality of the solar cells and a second surface opposite to the first surface;

a convex portion locally printed on the second surface of the transparent glass and corresponding to the ribbons; and a light refraction pattern film formed over the convex portion and the transparent glass and having a light refraction pattern having a convex shape corresponding to the convex portion, wherein a refractive index of the convex portion is different from a refractive index of the light refraction pattern film, wherein the light refraction pattern film is formed of a thermoplastic polymer, wherein the light refraction pattern refracts and concentrates incident light, wherein the light refraction pattern has a shape that extends along areas where the ribbons are formed, and wherein, at the light refraction pattern, a first surface of the light refraction pattern film facing the convex portion and a second surface of the light refraction pattern film that is opposite the first surface both have a curved surface.

2. The solar cell module according to claim 1, wherein the solar cell module further comprises a plurality of light refraction patterns arranged to form a lattice shape such that the plurality of solar cells are disposed within the plurality of light refraction patterns, respectively.

3. The solar cell module according to claim 1, wherein:

the plurality of solar cells are arranged in a form of a matrix having a plurality of rows and a plurality of columns;

a peripheral area comprises first peripheral areas each defined between adjacent ones of the plurality of solar cells arranged in adjacent ones of the plurality of rows of the plurality of solar cells, respectively, second peripheral areas each defined between adjacent ones of the plurality of solar cells arranged in adjacent ones of the plurality of columns of the plurality of solar cells, respectively, and third peripheral areas respectively defined in spaces where the first peripheral areas and the second peripheral areas cross each other; and the light refraction pattern comprises at least first refraction patterns formed at positions overlapping with corresponding ones of the first peripheral areas, respectively, second refraction patterns formed at positions overlapping with corresponding ones of the second peripheral areas, respectively, or third refraction patterns formed at positions overlapping with corresponding ones of the third peripheral areas, respectively.

4. The solar cell module according to claim 3, wherein the third refraction patterns are disposed in the third peripheral areas, respectively.

5. The solar cell module according to claim 3, wherein at least the first refraction patterns, the second refraction patterns, or the third refraction patterns are disposed to overlap with the plurality of solar cells, respectively.

6. The solar cell module according to claim 1, further comprising at least one protective film that comprises an anti-reflective film.

7. The solar cell module according to claim 1, wherein the front substrate is formed with an alignment mark for aligning a light refraction pattern with a dead area.

8. The solar cell module according to claim 1, wherein the convex portion has edge parts and a middle part that is between the edge parts, and wherein the middle part is thicker than the edge parts.

9. The solar cell module according to claim 1, wherein the convex portion has a curved cross-section or a triangular cross-section.

10. The solar cell module according to claim 1, wherein the first and second surfaces of the light refraction pattern film are flat in areas not over the convex portion.

* * * * *